US009159681B2

(12) United States Patent
Nakayama et al.

(10) Patent No.: US 9,159,681 B2
(45) Date of Patent: Oct. 13, 2015

(54) SEMICONDUCTOR DEVICE AND METHOD OF MANUFACTURING THE SAME

(71) Applicant: Renesas Electronics Corporation, Kawasaki-shi (JP)

(72) Inventors: Sadao Nakayama, Kawasaki (JP); Yoshihiro Matsuura, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/949,185

(22) Filed: Jul. 23, 2013

(65) Prior Publication Data

US 2014/0027919 A1 Jan. 30, 2014

(30) Foreign Application Priority Data

Jul. 30, 2012 (JP) ................................. 2012-168541

(51) Int. Cl.
*H01L 23/48* (2006.01)
*H01L 23/00* (2006.01)
(Continued)

(52) U.S. Cl.
CPC .......... *H01L 24/03* (2013.01); *H01L 23/49838* (2013.01); *H01L 24/02* (2013.01);
(Continued)

(58) Field of Classification Search
CPC ................. H01L 2224/45; H01L 2924/15311; H01L 2224/97; H01L 2224/92247; H01L 2224/73265; H01L 2224/48227; H01L 2224/32225; H01L 2224/04042; H01L 2224/48091; H01L 2924/00012; H01L 24/03; H01L 24/02; H01L 23/49838; H01L 24/97; H01L 24/05; H01L 24/45; H01L 24/06; H01L 24/49; H01L 2224/4505; H01L 2224/48228

USPC ......... 257/679, 685, 686, 690, 693, 698, 700, 257/723, 724, 737, 738, 773, 774, 777, 778, 257/780, 783, 784, 786, E23.02, E23.037, 257/E23.01, E21.506, E23.067, 678, 672, 257/673, 676, 677, E23.012, E21.531
See application file for complete search history.

(56) References Cited

U.S. PATENT DOCUMENTS 6,121,690 A * 9/2000 Yamada et al. ................ 257/784
6,534,879 B2 * 3/2003 Terui ............................. 257/786
(Continued)

FOREIGN PATENT DOCUMENTS

JP 2008-004650 A 1/2008
JP 2010-278138 A 12/2010
(Continued)

OTHER PUBLICATIONS

Japanese Office Action dated Aug. 4, 2015 with an English translation.

*Primary Examiner* — Yosef Gebreyesus
(74) *Attorney, Agent, or Firm* — McGinn IP Law Group, PLLC

(57) ABSTRACT

A semiconductor device which uses a semiconductor chip originally designed for flip chip bonding and is assembled by a wire bonding process to reduce the cost of assembling a semiconductor product. A second electrode pad group and a fourth electrode pad group are located in the central area of the semiconductor chip and a first electrode pad group and a third electrode pad group are located adjacently to the two long sides of the semiconductor chip. The electrode pads of each electrode group are electrically coupled with a plurality of conductive wires. The layouts of the wiring layers formed in an interconnection substrate are modified so that the wire-bonded semiconductor device is the same as a flip-chip-bonded semiconductor device in terms of the positions of input/output signals.

15 Claims, 18 Drawing Sheets

(51) Int. Cl.
*H01L 23/498* (2006.01)
*H01L 23/31* (2006.01)
*H01L 23/50* (2006.01)
*H01L 21/56* (2006.01)

(52) U.S. Cl.
CPC .............. *H01L 24/05* (2013.01); *H01L 24/06* (2013.01); *H01L 24/49* (2013.01); *H01L 24/97* (2013.01); *H01L 21/561* (2013.01); *H01L 23/3128* (2013.01); *H01L 23/50* (2013.01); *H01L 24/45* (2013.01); *H01L 2224/04042* (2013.01); *H01L 2224/05554* (2013.01); *H01L 2224/0612* (2013.01); *H01L 2224/06155* (2013.01); *H01L 2224/06156* (2013.01); *H01L 2224/32225* (2013.01); *H01L 2224/45015* (2013.01); *H01L 2224/45144* (2013.01); *H01L 2224/48091* (2013.01); *H01L 2224/48227* (2013.01); *H01L 2224/48228* (2013.01); *H01L 2224/4917* (2013.01); *H01L 2224/73265* (2013.01); *H01L 2224/92247* (2013.01); *H01L 2224/97* (2013.01); *H01L 2924/00* (2013.01); *H01L 2924/15174* (2013.01); *H01L 2924/15311* (2013.01); *H01L 2924/3011* (2013.01)

(56) References Cited

U.S. PATENT DOCUMENTS

| | | | | |
|---|---|---|---|---|
| 6,621,169 B2 * | 9/2003 | Kikuma et al. | ............... | 257/780 |
| 6,717,270 B1 * | 4/2004 | Downey et al. | ............... | 257/758 |
| 6,777,799 B2 * | 8/2004 | Kikuma et al. | ............... | 257/686 |
| 6,812,580 B1 * | 11/2004 | Wenzel et al. | ............... | 257/784 |
| 6,900,551 B2 * | 5/2005 | Matsuzawa et al. | ......... | 257/786 |
| 7,119,446 B2 * | 10/2006 | Shimizu et al. | ............... | 257/780 |
| 7,705,469 B2 * | 4/2010 | Yoshida | ..................... | 257/777 |
| 8,018,037 B2 * | 9/2011 | Chen | ............................ | 257/676 |
| 8,310,032 B2 * | 11/2012 | Kawashima | ................. | 257/620 |
| 8,354,218 B2 | 1/2013 | Hirano et al. | | |
| 8,525,306 B2 * | 9/2013 | Tashiro et al. | ............... | 257/666 |
| 8,698,296 B2 * | 4/2014 | Taoka et al. | ................. | 257/686 |
| 8,786,083 B2 * | 7/2014 | Haba et al. | ................... | 257/738 |
| 2002/0089050 A1 * | 7/2002 | Michii et al. | .................. | 257/686 |
| 2003/0218245 A1 * | 11/2003 | Matsuzawa et al. | ......... | 257/734 |
| 2004/0150084 A1 * | 8/2004 | Nishida et al. | ............... | 257/678 |
| 2005/0104175 A1 * | 5/2005 | Itano et al. | ................... | 257/678 |
| 2005/0218490 A1 * | 10/2005 | Kanamori et al. | ............ | 257/678 |
| 2008/0237856 A1 * | 10/2008 | Hisada et al. | ................. | 257/738 |
| 2009/0294945 A1 * | 12/2009 | Okada et al. | .................. | 257/686 |
| 2010/0301468 A1 | 12/2010 | Watanabe et al. | | |
| 2010/0320623 A1 | 12/2010 | Kuroda et al. | | |
| 2011/0039207 A1 | 2/2011 | Hirano et al. | | |
| 2011/0180877 A1 * | 7/2011 | Koketsu et al. | ............... | 257/368 |
| 2011/0180934 A1 * | 7/2011 | Takeda et al. | ................. | 257/774 |
| 2012/0018859 A1 * | 1/2012 | Tashiro et al. | ................ | 257/666 |
| 2012/0133055 A1 * | 5/2012 | Machida | ....................... | 257/777 |
| 2013/0071129 A1 * | 3/2013 | Yoneda et al. | ................ | 398/214 |

FOREIGN PATENT DOCUMENTS

| | | |
|---|---|---|
| JP | 2011-003764 A | 1/2011 |
| JP | 2011-13502 A | 1/2011 |

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2012-168541 filed on Jul. 30, 2012 including the specification, drawings and abstract is incorporated herein by reference in its entirety.

BACKGROUND

The present invention relates to semiconductor devices and manufacturing technology therefor and more particularly to semiconductor devices in which semiconductor chips originally designed for flip chip bonding are assembled by a wire bonding process.

Japanese Unexamined Patent Application Publication No. 2011-13502 describes a technique that a bonding wire for reference to supply a return current for a desired signal is located adjacently to a bonding wire to transmit the desired signal in order to reduce characteristic impedance mismatching in bonding wires and a substrate.

Japanese Unexamined Patent Application Publication No. 2010-278138 discloses a technique that reduces stress due to a thermal expansion coefficient difference, by sealing resin between a semiconductor chip and an interconnection substrate and a technique that equalizes the stress on the semiconductor chip by sealing resin placed all around the semiconductor chip.

SUMMARY

In the past, when using a high-end semiconductor chip originally designed for flip chip bonding for a low-end product, the present inventors adopted a flip chip bonding process to assemble a semiconductor product. However, this approach has a problem that the semiconductor product assembling process based on the flip chip bonding process is complicated and special assembling equipment is required, resulting in a rise in the assembling cost.

The above and further objects and novel features of the invention will more fully appear from the following detailed description in this specification and the accompanying drawings.

According to one aspect of the present invention, a semiconductor chip originally designed for flip chip bonding is used to assemble a semiconductor device by a wire bonding process. Electrode pad groups are located in the central area of the semiconductor chip and adjacently to the long sides of the semiconductor chip and the electrode pads of each electrode group are electrically coupled with a plurality of conductive wires. The layouts of the wiring layers formed in the interconnection substrate on which the semiconductor chip is mounted are modified so that the wire-bonded semiconductor device is the same as a flip-chip-bonded semiconductor device in terms of the positions of input and output signals.

According to the present invention, a semiconductor chip originally designed for flip chip bonding can be used to assemble a semiconductor device by a wire bonding process, so that the cost of assembling a semiconductor product can be reduced.

DETAILED DESCRIPTION

Figure 1:
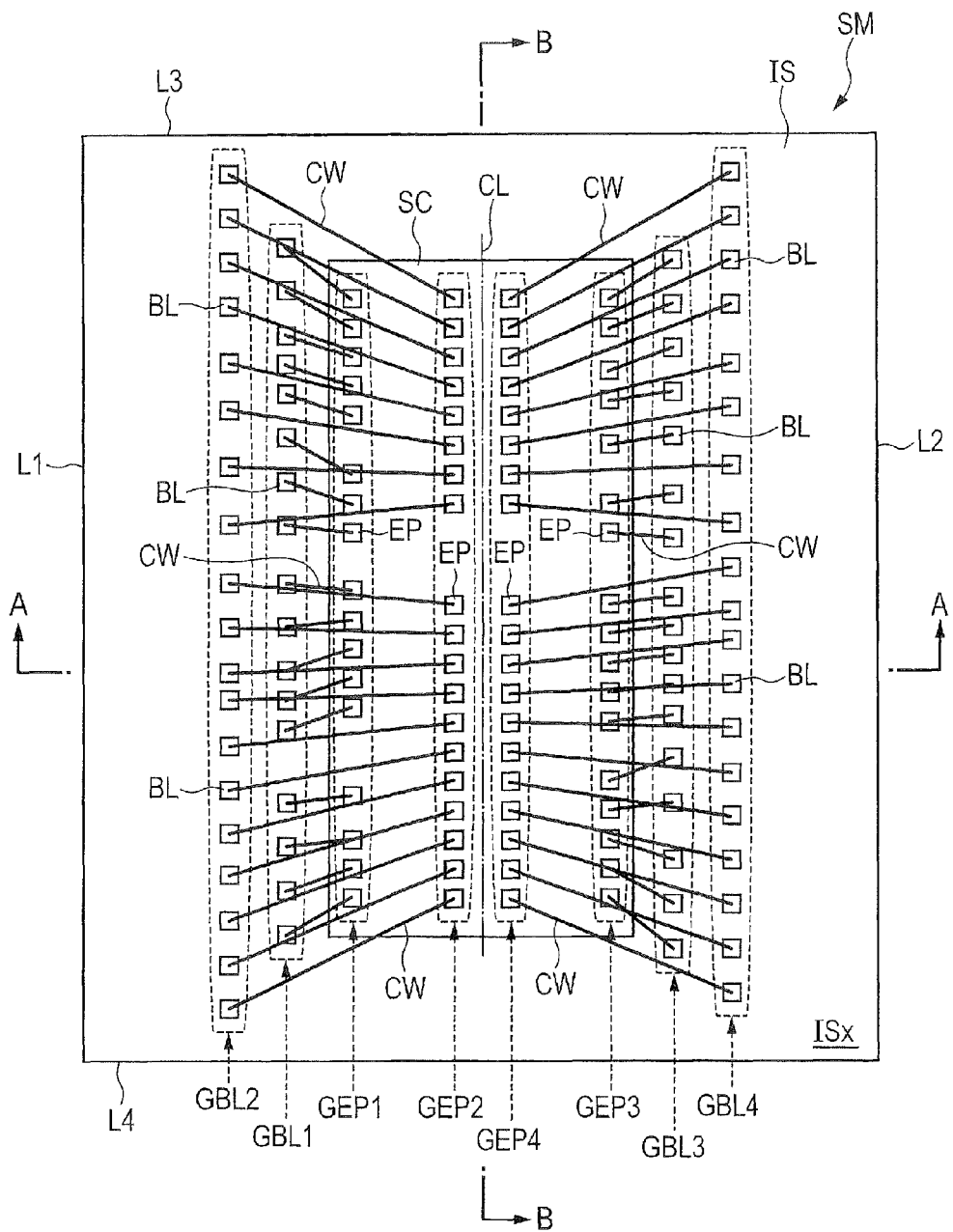
FIG. 1 is a plan view of an essential part of a semiconductor device based on a wire bonding process according to an embodiment of the invention.

Next, description of the preferred embodiment will be made below in different sections or separately as necessary, but such descriptions are not irrelevant to each other unless otherwise specified. One description may be, in whole or in part, a modified, detailed or supplementary form of another description.

Also, regarding the preferred embodiment described below, when a specific number (as the number of pieces, numerical value, quantity, range, etc.) is indicated for an element, it is not limited to the specific number unless explicitly specified so or theoretically limited to that number; it may be larger or smaller than the specific number.

Furthermore, in the preferred embodiment described below, constituent elements (including constituent steps) are not necessarily essential unless explicitly specified so or theoretically essential.

When the expression "comprise A", "comprised of A", "have A", or "include A" is used, a constituent element other than A is not excluded unless it is explicitly shown that the constituent element is limited to A. Similarly, in the preferred embodiment described below, when a specific form or positional relation is indicated for an element, it should be interpreted to include a form or positional relation which is virtually equivalent or similar to the specific form or positional relation unless explicitly specified so or theoretically limited to the specific form or positional relation. The same can be said of numerical values and ranges, as mentioned above.

Regarding the drawings that illustrate the preferred embodiment, hatching may be used even in a plan view for easy understanding. In all the drawings that illustrate the preferred embodiment, elements with like functions are designated by like reference signs and repeated descriptions thereof are omitted. Next, the preferred embodiment will be described in detail referring to the drawings.

First Embodiment

In the past, when a semiconductor chip originally designed as a high-end product for flip chip bonding, for example, a semiconductor chip with a high-speed SRAM (Static Random Access Memory) for communications formed therein has been used for a low-end product, a flip chip bonding process has been employed to assemble the semiconductor product. However, the semiconductor product assembling process based on the flip chip bonding process is complicated and also the assembling cost is high since semiconductor products are generally manufactured in wide variety and in small quantities.

For this reason, in this embodiment, in order to reduce the cost of assembling a semiconductor product, a wire bonding process is used to assemble a semiconductor product based on a semiconductor chip originally designed for flip chip bonding.

Semiconductor Device

Figure 2:
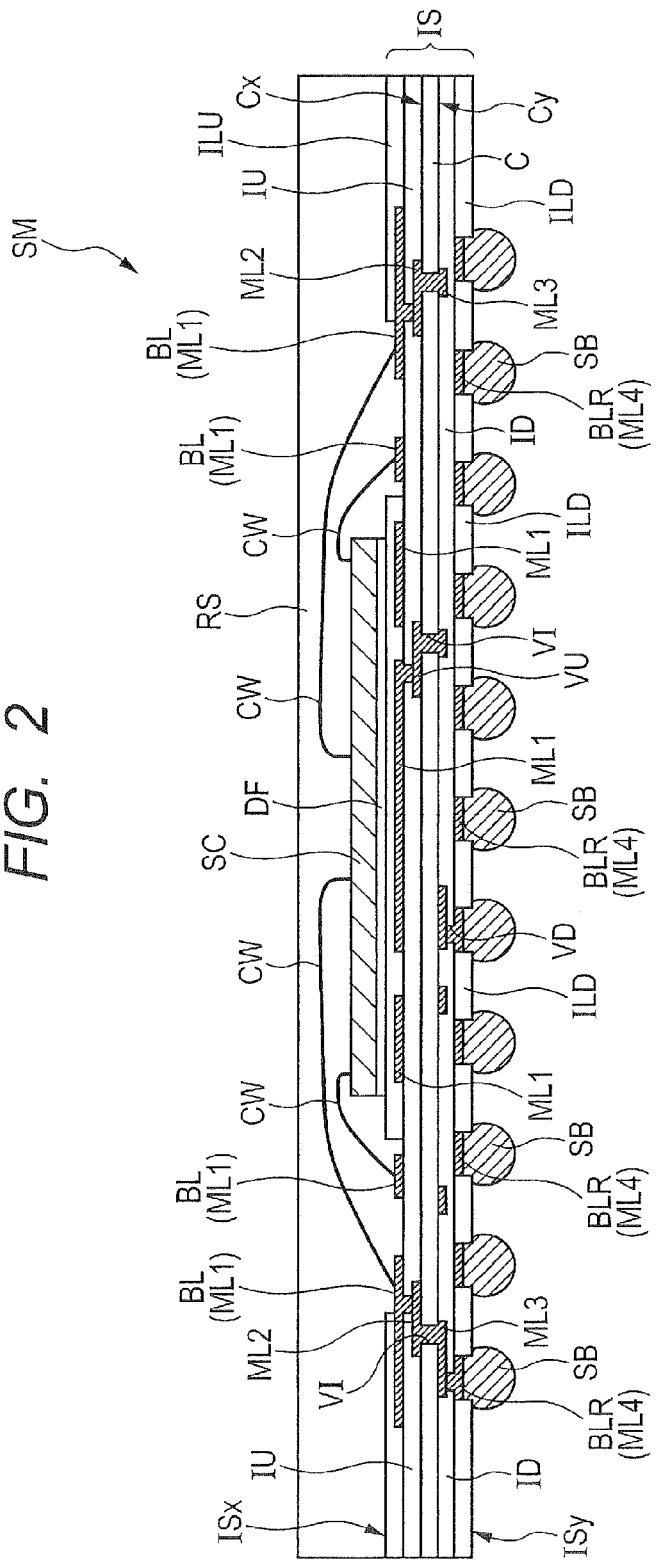
FIG. 2 is a sectional view of the essential part of the semiconductor device based on the wire bonding process according to the embodiment (taken along the line A-A of FIG. 1)
Figure 3:
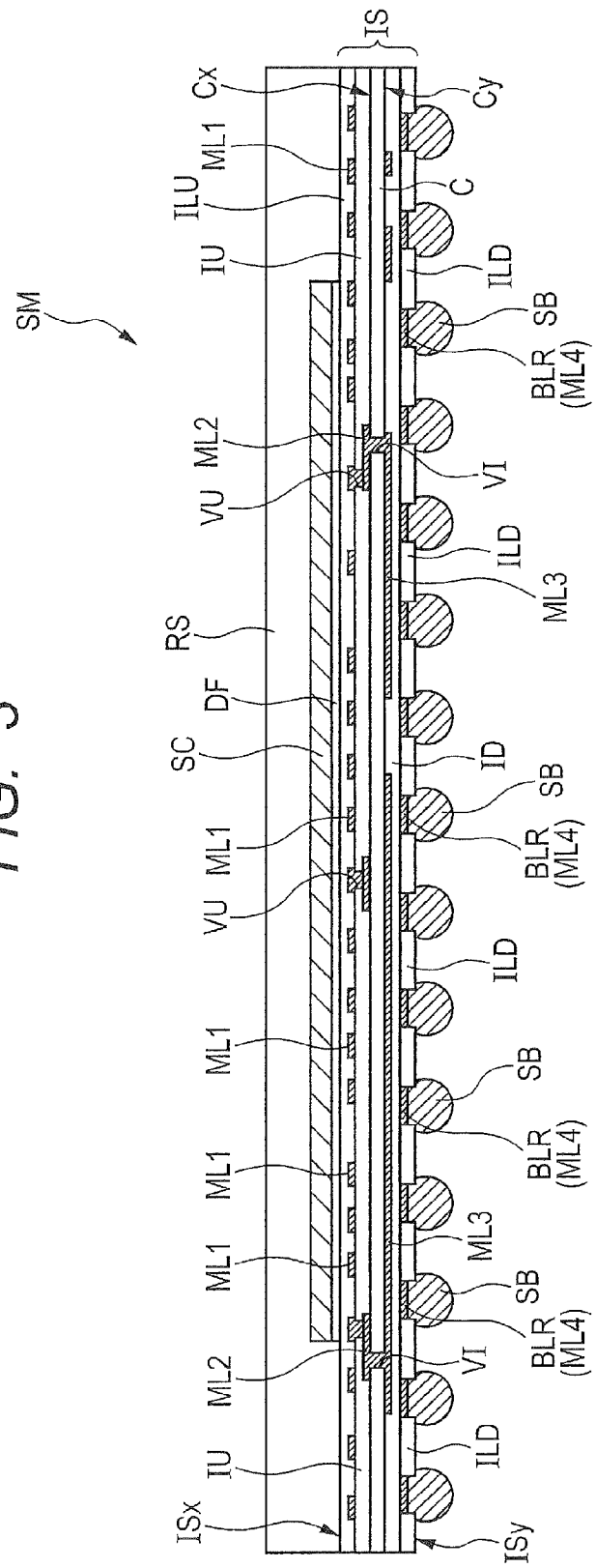
FIG. 3 is a sectional view of the essential part of the semiconductor device based on the wire bonding process according to the embodiment (taken along the line B-B of FIG. 1)

Next, a semiconductor device with a semiconductor chip mounted on an interconnection substrate (package substrate) according to this embodiment will be described referring to FIGS. 1 to 3. FIG. 1 is a plan view of an essential part of the semiconductor device based on a wire bonding process according to this embodiment. FIG. 2 is a sectional view of the essential part of the semiconductor device based on the wire bonding process according to the embodiment (taken along the line A-A of FIG. 1). FIG. 3 is a sectional view of the essential part of the semiconductor device based on the wire bonding process according to the embodiment (taken along the line B-B of FIG. 1).

This embodiment shows an example of a face-up BGA (Ball Grid Array) type semiconductor device based on a wire bonding process.

As shown in FIGS. 1, 2, and 3, the semiconductor device SM according to the embodiment includes an interconnection substrate (package substrate) IS, a semiconductor chip SC, a plurality of external terminals (bump electrodes or solder balls) SB, a plurality of conductive wires CW, and a resin sealing body (sealing resin) RS.

More specifically, the semiconductor device SM includes an interconnection substrate IS, a semiconductor chip SC which is mounted on the upper surface (main surface or front surface) ISx of the interconnection substrate IS and has a semiconductor element formed thereon, and a plurality of external terminals SB mounted on the lower surface (mounting surface or back surface) ISy of the interconnection substrate IS and electrically coupled with a plurality of bump lands (electrode pads) BLR formed on the surface of an insulating layer ID of the interconnection substrate IS. The semiconductor device SM further includes a plurality of conductive wires CW which electrically couple a plurality of electrode pads EP formed on the main surface (front surface) of the semiconductor chip SC with a plurality of bonding pads (electrode pads or bond fingers) BL formed on the surface of an insulating layer IU of the interconnection substrate IS. A resin sealing body RS which seals the semiconductor chip SC and the conductive wires CW lies over the upper surface ISx of the interconnection substrate IS.

Semiconductor Chip

The semiconductor chip SC has a main surface in which a semiconductor element is formed, and a back surface opposite to the main surface and is mounted on the upper surface ISx of the interconnection substrate IS, in which the upper surface ISx of the interconnection substrate IS faces the back surface of the semiconductor chip SC.

The semiconductor chip SC, mounted on the upper surface ISx of the interconnection substrate IS through a bonding adhesive (bonding layer, die bond) DF, has a plane intersecting its thickness direction which has a rectangular shape composed of two opposite long sides and two opposite short sides and measures, and for example, its dimensions are 11 mm by 5 mm and its thickness is 0.2 mm. The bonding adhesive DF used in this embodiment is, for example, in the form of film (resin sheet).

The semiconductor chip SC mainly includes a semiconductor substrate, a plurality of semiconductor elements formed in the main surface (front side) of the semiconductor substrate), a multilayer interconnection layer having a plurality of insulating layers and wiring layers stacked on one another in the main surface of the semiconductor substrate, and a surface protective film formed to cover the multilayer interconnection layer, though not limited to these. The insulating layers are, for example, silicon oxide film. The wiring layers are metal film of, for example, aluminum, tungsten or copper. The surface protective film is an inorganic insulating film such as silicon oxide film or silicon nitride film and a multilayer film as a laminate of organic insulating films.

A plurality of electrode pads EP electrically coupled with the above semiconductor element are formed on the main surface of the semiconductor chip SC. Assuming that the line connecting the centers of the two short sides of the semiconductor chip SC is a virtual centerline CL, between one long side of the semiconductor chip SC and the virtual centerline CL, a plurality of electrode pads EP are arranged in a row adjacently to one long side of the semiconductor chip SC and a plurality of electrode pads EP are arranged in a row adjacently to the virtual centerline CL. Similarly, between the other long side of the semiconductor chip SC and the virtual centerline CL, a plurality of electrode pads EP are arranged in a row adjacently to the other long side of the semiconductor chip SC and a plurality of electrode pads EP are arranged in a row adjacently to the virtual centerline CL.

In other words, in the main surface of the semiconductor chip SC, a plurality of electrode pads EP parallel and adjacent to one long side are arranged in a row as a first electrode group GEP1 and between the first electrode pad group GEP1 and the virtual centerline CL, a plurality of electrode pads EP parallel to the one long side and adjacent to the virtual centerline CL are arranged in a row as a second electrode pad group GEP2.

Similarly, on the main surface of the semiconductor chip SC, a plurality of electrode pads EP parallel and adjacent to the other long side are arranged in a row as a third electrode group GEP3 and between the third electrode pad group GEP3 and the virtual centerline CL, a plurality of electrode pads EP parallel to the other long side and adjacent to the virtual centerline CL are arranged in a row as a fourth electrode pad group GEP4.

The reason that there are a plurality of electrode pads EP in the central area of the semiconductor chip SC (the second electrode pad group GEP2 and fourth electrode pad group GEP4 located adjacent to the virtual centerline as shown in FIG. 1) is that the semiconductor chip SC is originally designed for flip chip bonding as mentioned above.

In the second electrode pad group GEP2, located adjacent to the virtual centerline CL, the interval between neighboring electrode pads EP in the center of the row is larger than the interval between neighboring electrode pads EP in the other portions of the row. Similarly, in the fourth electrode pad group GEP4, located adjacent to the virtual centerline CL, the interval between neighboring electrode pads EP in the center of the row is larger than the interval between neighboring electrode pads EP in the other portions of the row.

The first electrode pad group GEP1 and third electrode pad group GEP3 are symmetrical with respect to the virtual centerline CL and the second electrode pad group GEP2 and fourth electrode pad group GEP4 are symmetrical with respect to the virtual centerline CL.

These electrode pads EP are formed in the uppermost layer of the multilayer interconnection layer of the semiconductor chip SC and are exposed through openings made in the surface protective film of the semiconductor chip SC so as to match the respective electrode pads EP.

Interconnection Substrate

The interconnection substrate IS has a rectangular plane intersecting its thickness direction, in which the rectangle has a first side L1, a second side L2 opposite to the first side L1, a third side L3 orthogonal to the first side L1, and a fourth side L4 opposite to the third side L3. For example, its planar dimensions are 15 mm by 13 mm. The interconnection substrate IS has a multilayer interconnection structure and in this embodiment, it has four wiring layers ML1, ML2, ML3, and ML4.

More specifically, the interconnection substrate IS has a core material (base material) C, a wiring layer formed over the front surface Cx of the core material C (the second wiring layer from top in the interconnection substrate IS as shown in FIGS. 2 and 3 (second wiring layer)) ML2, an insulating layer (upper insulating layer) IU formed so as to cover the wiring layer ML2, and an uppermost wiring layer (the uppermost wiring layer in the interconnection substrate IS as shown in FIGS. 2 and 3 (first wiring layer)) ML1 formed over the surface of the insulating layer IU. A plurality of bonding pads BL as portions of the uppermost wiring layer ML1 are exposed from a protective film ILU formed so as to cover the uppermost wiring layer ML1.

The interconnection substrate IS further has a wiring layer formed over the back surface Cy opposite to the front surface Cx of the core material C (the third wiring layer from top in the interconnection substrate IS as shown in FIG. 2 and (third wiring layer)) ML3, an insulating layer (lower insulating layer) ID formed so as to cover the wiring layer ML3, and a lowermost wiring layer (the lowermost wiring layer in the interconnection substrate IS as shown in FIGS. 2 and 3 (fourth wiring layer)) ML4 formed over the surface of the insulating layer ID. A plurality of bump lands BLR as portions of the lowermost wiring layer ML4 are exposed from a protective film ILD formed so as to cover the lowermost wiring layer ML4.

The wiring layers ML1, ML2, ML3, and ML4 of the interconnection substrate IS are copper-based metal film. The protective film ILU on the upper surface ISx side of the interconnection substrate IS is primarily intended to protect the wiring layer ML1 formed in the uppermost layer of the interconnection substrate IS and the protective film ILD on the lower surface ISy side of the interconnection substrate IS is primarily intended to protect the wiring layer ML4 formed in the lowermost layer of the interconnection substrate IS.

Furthermore, the interconnection substrate IS has conductive members (wirings) inside (in the inner walls) a plurality of through holes VU formed in the insulating layer IU, a plurality of through holes VD formed in the insulating layer ID, and a plurality of through holes (vias) VI running from the front surface Cx of the core material C to the back surface Cy. The insulating layers ID and IU are made of high-elasticity resin such as glass fiber impregnated with epoxy or polyimide thermosetting resin.

A plurality of bonding pads BL are formed in the upper surface ISx of the interconnection substrate IS. As mentioned above, these bonding pads BL are portions of the uppermost wiring layer ML1 and exposed through openings made in the protective film ILU so as to match the bonding pads BL respectively.

The bonding pads BL are located outside the region where the semiconductor chip SC is mounted, between one long side of the semiconductor chip SC and the first side L1 of the interconnection substrate IS and between the other long side of the semiconductor chip SC and the second side L2 of the interconnection substrate IS.

In other words, on the upper surface ISx of the interconnection substrate IS, a plurality of bonding pads BL are arranged in a row as a first bonding pad group GBL1 between one long side of the semiconductor chip SC and the first side L1 of the interconnection substrate IS, parallel to the first side L1 of the interconnection substrate IS. Also a plurality of bonding pads BL are arranged in a row as a second bonding pad group GBL2 between the first bonding pad group GBL1 and the first side L1 of the interconnection substrate IS, parallel to the first side L1 of the interconnection substrate IS. Furthermore, on the upper surface ISx of the interconnection substrate IS, a plurality of bonding pads BL are arranged in a row as a third bonding pad group GBL3 between the other long side of the semiconductor chip SC and the second side L2 of the interconnection substrate IS, parallel to the second side L2 of the interconnection substrate IS. Also a plurality of bonding pads BL are arranged in a row as a fourth bonding pad group GBL4 between the third bonding pad group GBL3 and the second side L2 of the interconnection substrate IS, parallel to the second side L2 of the interconnection substrate IS.

With respect to the virtual centerline CL, the first bonding pad group GBL1 and third bonding pad group GBL3 are symmetrical and the second bonding pad group GBL2 and fourth bonding pad group GBL4 are symmetrical.

On the lower side ISy of the interconnection substrate IS, a plurality of bump lands BLR are formed. As mentioned above, these bump lands BLR are portions of the lowermost wiring layer ML4 and exposed through openings made in the protective film ILD so as to match the bump lands BLR respectively.

Major features of this embodiment are the planar layout of the uppermost wiring layer ML1 and the planar layout of the wiring layer ML3 formed on the back surface of the core material C. Details and effects of the layouts will become apparent from the description given below with reference to FIGS. 4 to 8.

The uppermost wirings ML1 and the lowermost wirings ML4 which are formed in the interconnection substrate IS are electrically coupled by the conductive members (wirings) made inside (on the inner walls of) the through holes VU made in the insulating layer IU, the holes VI penetrating the core material C, and the through holes VD made in the insulating layer ID, respectively.

Conductive Wire

The electrode pads EP formed on the main surface of the semiconductor chip SC and the bonding pads BL formed on the upper surface ISx of the interconnection substrate IS are electrically coupled by a plurality of conductive wires CW (some of the conductive wires CW are shown in FIG. 2), respectively. The conductive wires CW are, for example, gold wires with a diameter of 23 microns. The conductive wires CW are bonded to the electrode pads EP on the main surface of the semiconductor chip SC and the bonding pads BL on the upper surface ISx of the interconnection substrate IS, for example, by a nail head bonding (ball bonding) process as a combination of thermal compression and ultrasonic oscillation.

As mentioned above, the first electrode pad group GEP1, second electrode pad group GEP2, third electrode pad group GEP3, and fourth electrode pad group GEP4 are formed on the main surface of the semiconductor chip SC. Also the first bonding pad group GBL1, second bonding pad group GBL2, third bonding pad group GBL3, and fourth bonding pad group GBL4 are formed on the upper surface ISx of the interconnection substrate IS.

The electrode pads EP of the first electrode pad group GEP1 are coupled with the bonding pads BL of the first bonding pad group GBL1 by conductive wires CW respectively. Similarly the electrode pads EP of the second electrode pad group GEP2 are coupled with the bonding pads BL of the second bonding pad group GBL2 by conductive wires CW respectively.

The conductive wires CW which couple the second electrode pad group GEP2 and the second bonding pad group GBL2 must be prevented from contacting the conductive wires CW which couple the first electrode pad group GEP1 and the first bonding pad group GBL1. For this reason, the conductive wires CW which couple the second electrode pad group GEP2 and the second bonding pad group GBL2 are spaced from and located above the conductive wires CW which couple the first electrode pad group GEP1 and the first bonding pad group GBL1.

Therefore the conductive wires CW which couple the second electrode pad group GEP2 and the second bonding pad group GBL2 are longer than the conductive wires CW which couple the first electrode pad group GEP1 and the first bonding pad group GBL1. For example, the length of the conductive wires CW which couple the second electrode pad group GEP2 and the second bonding pad group GBL2 is in the range of 0.8 to 1.1 mm and the length of the conductive wires CW which couple the first electrode pad group GEP1 and the first bonding pad group GBL1 is in the range of 3.5 to 4.0 mm.

Similarly, the electrode pads EP of the third electrode pad group GEP3 are coupled with the bonding pads BL of the third bonding pad group GBL3 by conductive wires CW respectively and the electrode pads EP of the fourth electrode pad group GEP4 are coupled with the bonding pads BL of the fourth bonding pad group GBL4 by conductive wires CW respectively.

The conductive wires CW which couple the fourth electrode pad group GEP4 and the fourth bonding pad group GBL4 must be prevented from contacting the conductive wires CW which couple the third electrode pad group GEP3 and the third bonding pad group GBL3. For this reason, the conductive wires CW which couple the fourth electrode pad group GEP4 and the fourth bonding pad group GBL4 are spaced from and located above the conductive wires CW which couple the third electrode pad group GEP3 and the third bonding pad group GBL3.

Therefore the conductive wires CW which couple the fourth electrode pad group GEP4 and the fourth bonding pad group GBL4 are longer than the conductive wires CW which couple the third electrode pad group GEP3 and the third bonding pad group GBL3. For example, the length of the conductive wires CW which couple the fourth electrode pad group GEP4 and the fourth bonding pad group GBL4 is in the range of 0.8 to 1.1 mm and the length of the conductive wires CW which couple the third electrode pad group GEP3 and the third bonding pad group GBL3 is in the range of 3.5 to 4.0 mm.

The interval between neighboring bonding pads BL of the second bonding pad group GBL2 is longer than the interval between neighboring electrode pads EP of the second electrode pad group GEP2. Similarly, the interval between neighboring bonding pads BL of the fourth bonding pad group GBL4 is longer than the interval between neighboring electrode pads EP of the fourth electrode pad group GEP4. Therefore, if a plurality of electrode pads EP are arranged in a row at regular intervals, conductive wires CW which are nearer to the third side L3 and fourth side L4 of the interconnection substrate IS would be longer.

However, in this embodiment, in the second electrode pad group GEP2 and fourth electrode pad group GEP4 on the main surface of the semiconductor chip SC, the interval between neighboring electrode pads located in the center is larger than the interval between neighboring electrode pads EP in the other areas. Consequently, the length range of conductive wires CW in this embodiment is narrower than when electrode pads EP are arranged in a row at regular intervals and for example, it is 3.5 to 4.0 mm.

Resin Sealing Body

The semiconductor chip SC and the conductive wires CW are sealed by the resin sealing body RS formed over the upper surface ISx of the interconnection substrate IS. In order to achieve high fluidity, the resin sealing body RS is made of, for example, epoxy thermosetting insulating resin to which a phenol cure agent and a high mass fraction (for example, 80 to 90%) of filler (for example, molten silica) are added.

External Terminal

A plurality of external terminals SB are formed on the lower surface ISy of the interconnection substrate IS and these external terminals SB are electrically and mechanically coupled with the bump lands BLR respectively. For the external terminals SB, lead-free solder bumps which contain virtually no lead, for example, Sn-3 [wt %]Ag-0.5 [wt. %] Cu solder bumps, are used.

Interconnection Substrate (Package Substrate)

Figure 4:
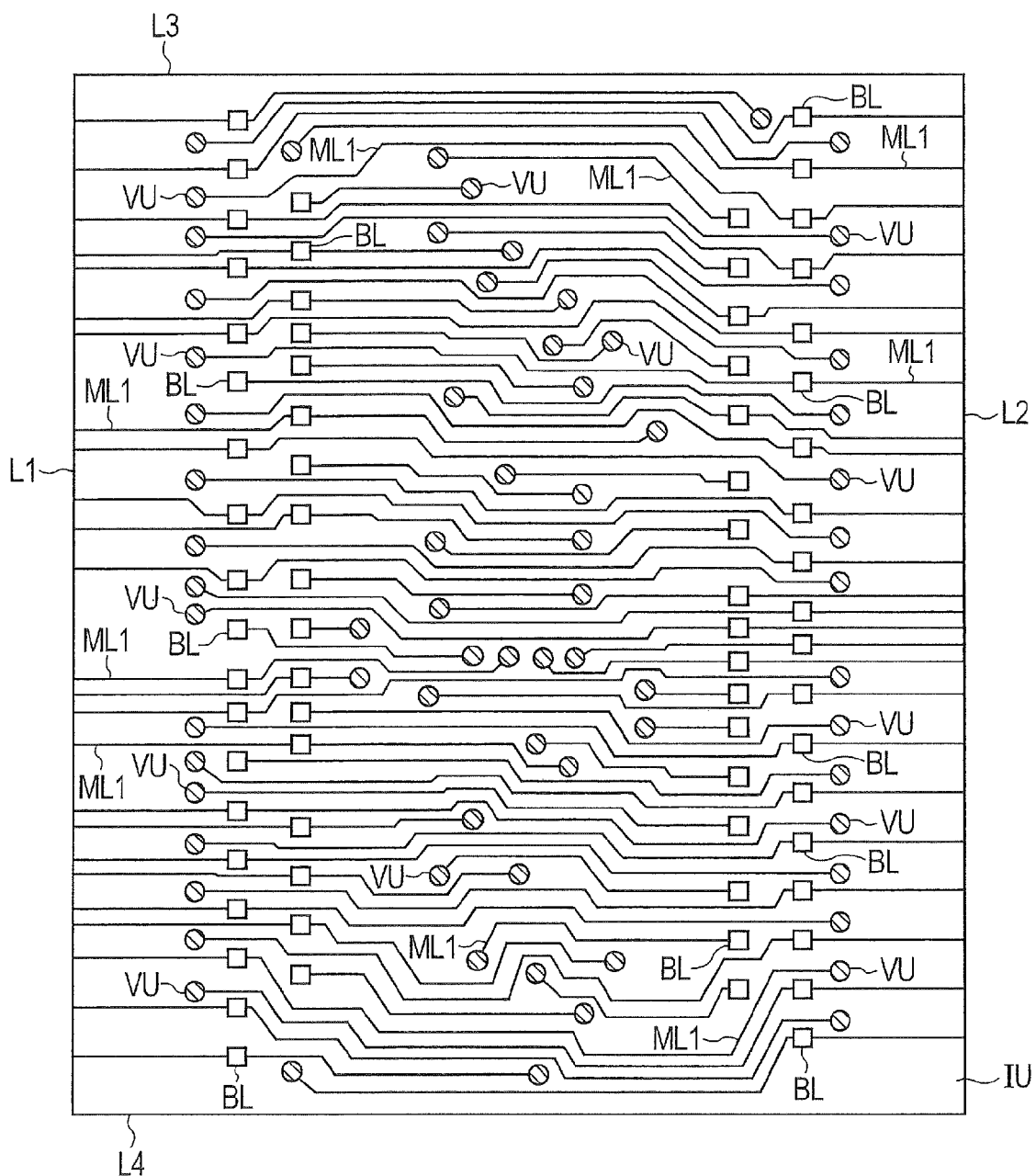
FIG. 4 is a plan view of an essential part of the front surface (first surface) of the upper insulating layer of an interconnection substrate according to the embodiment.
Figure 5:
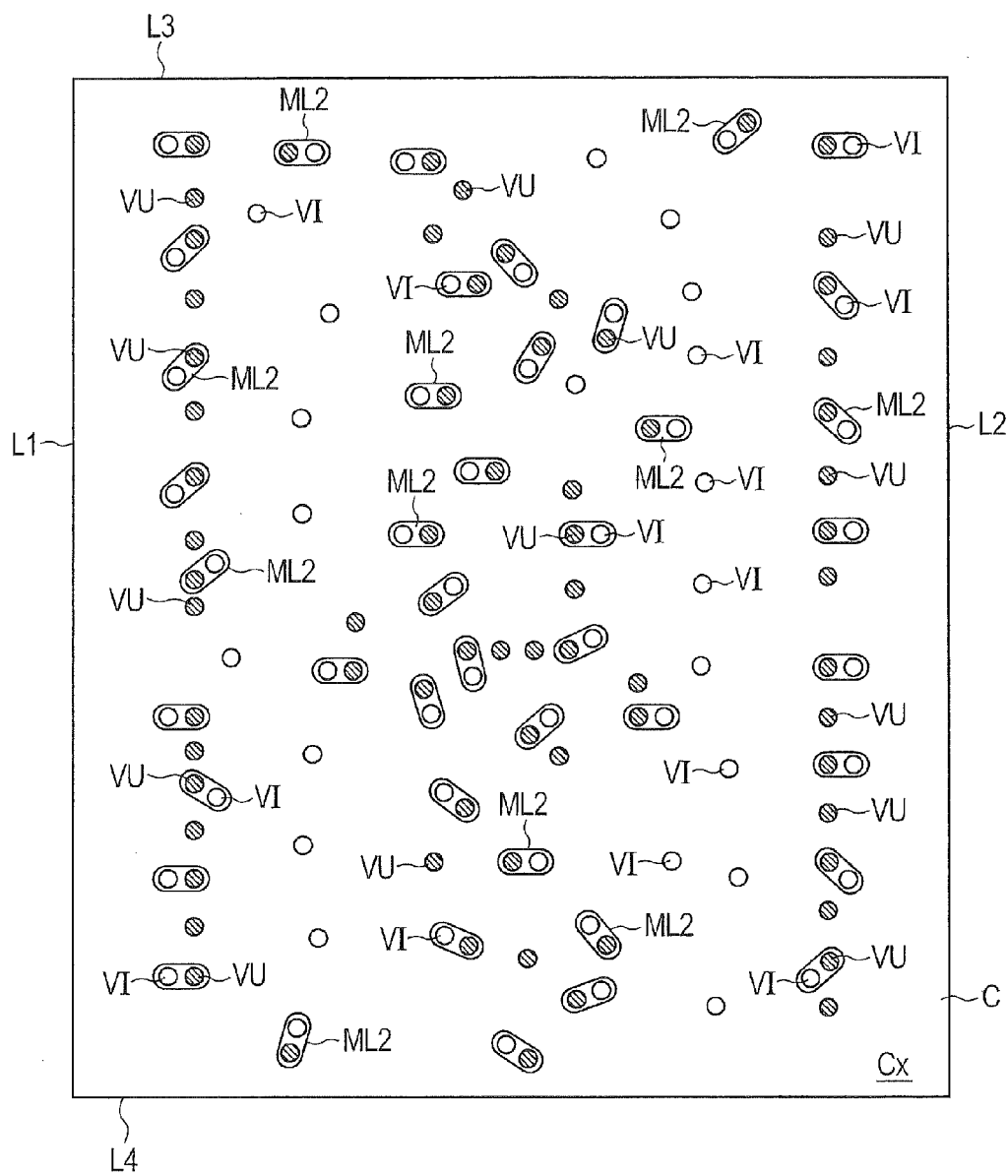
FIG. 5 is a plan view of an essential part of the front surface (second surface) of the core material (base material) of the interconnection substrate according to the embodiment.
Figure 6:
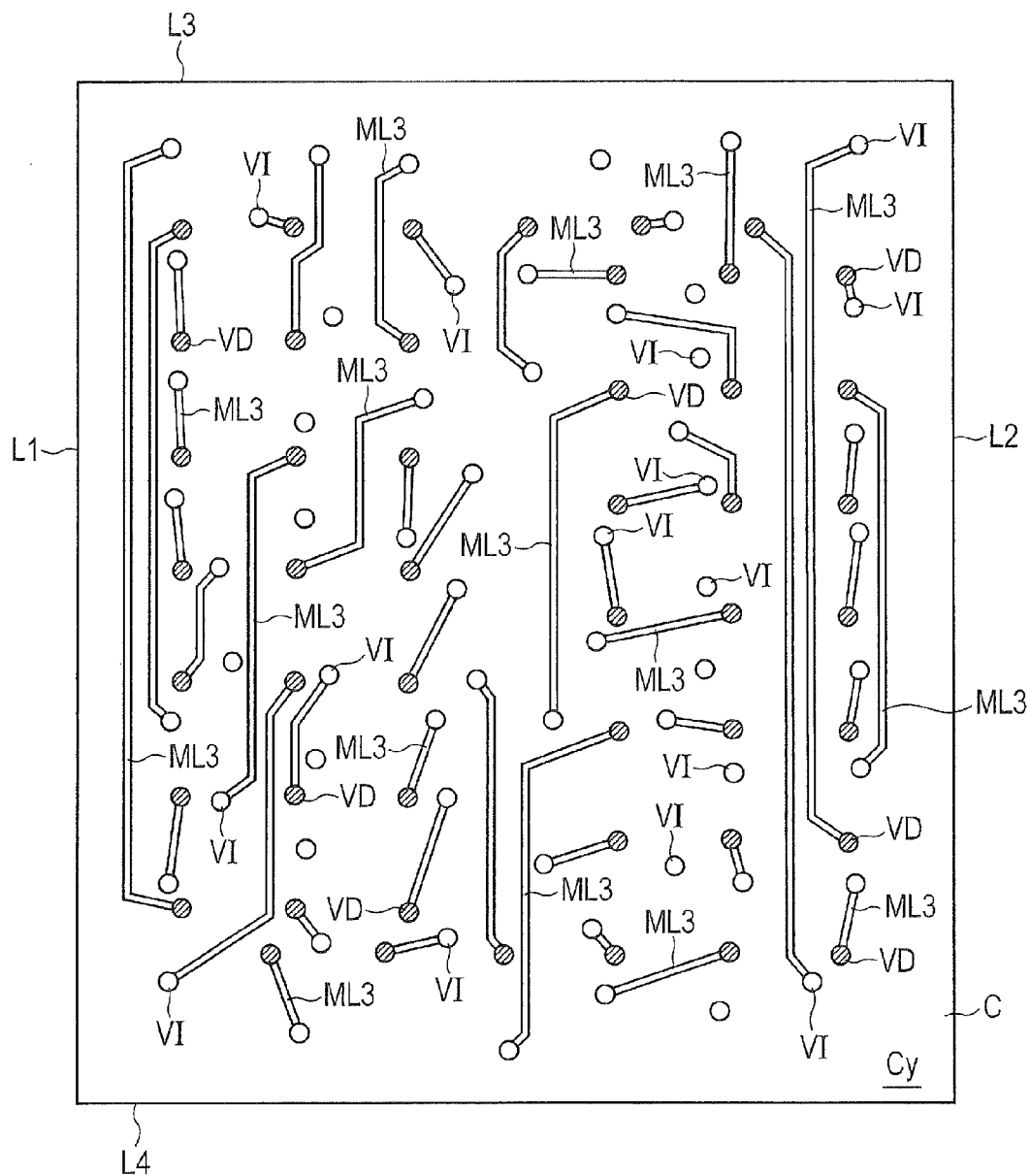
FIG. 6 is a plan view of an essential part of the back surface (third surface) of the core material (base material) of the interconnection substrate according to the embodiment.
Figure 7:
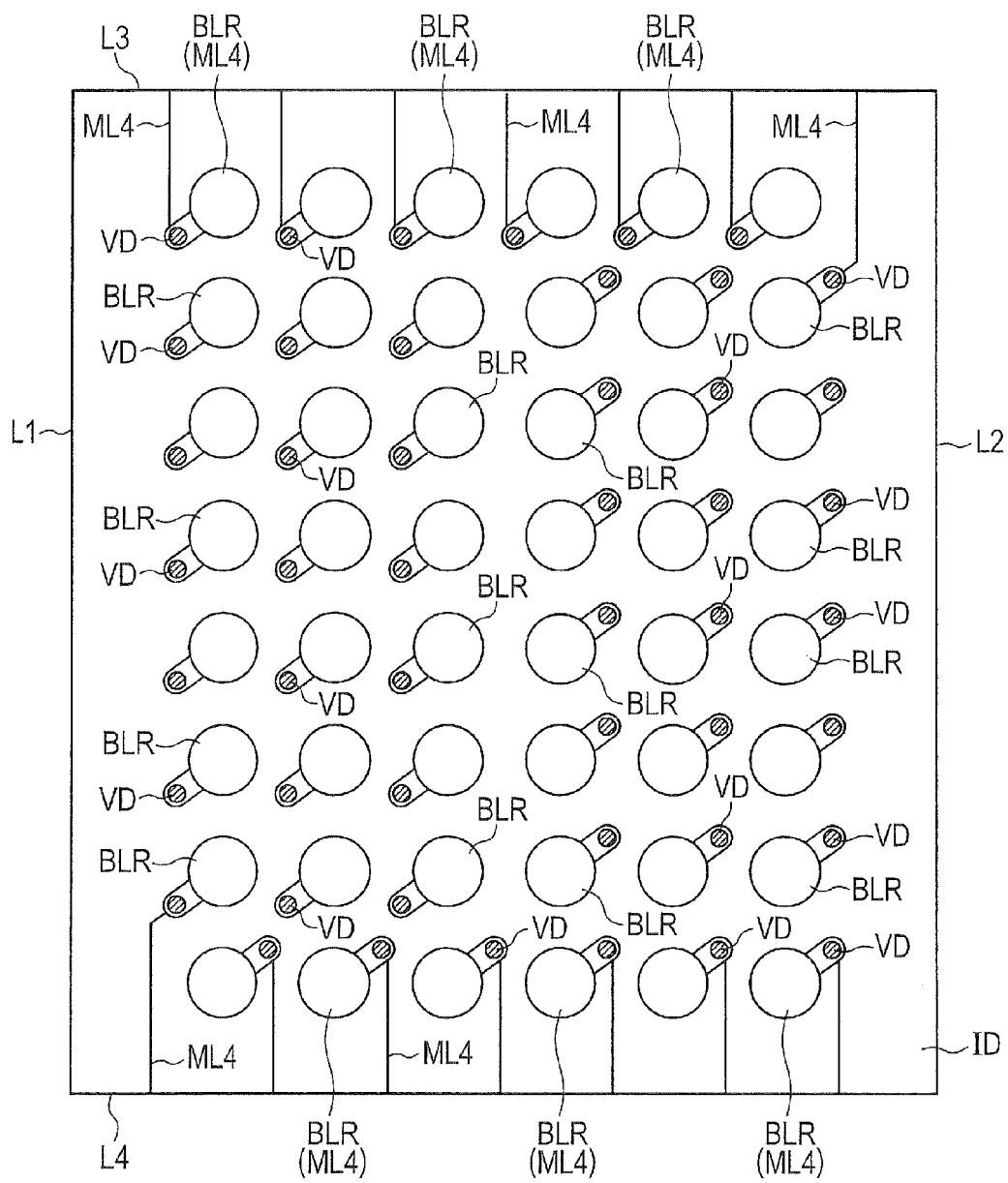
FIG. 7 is a plan view of an essential part of the surface (fourth surface) of the lower insulating layer of the interconnection substrate according to the embodiment.
Figure 8:
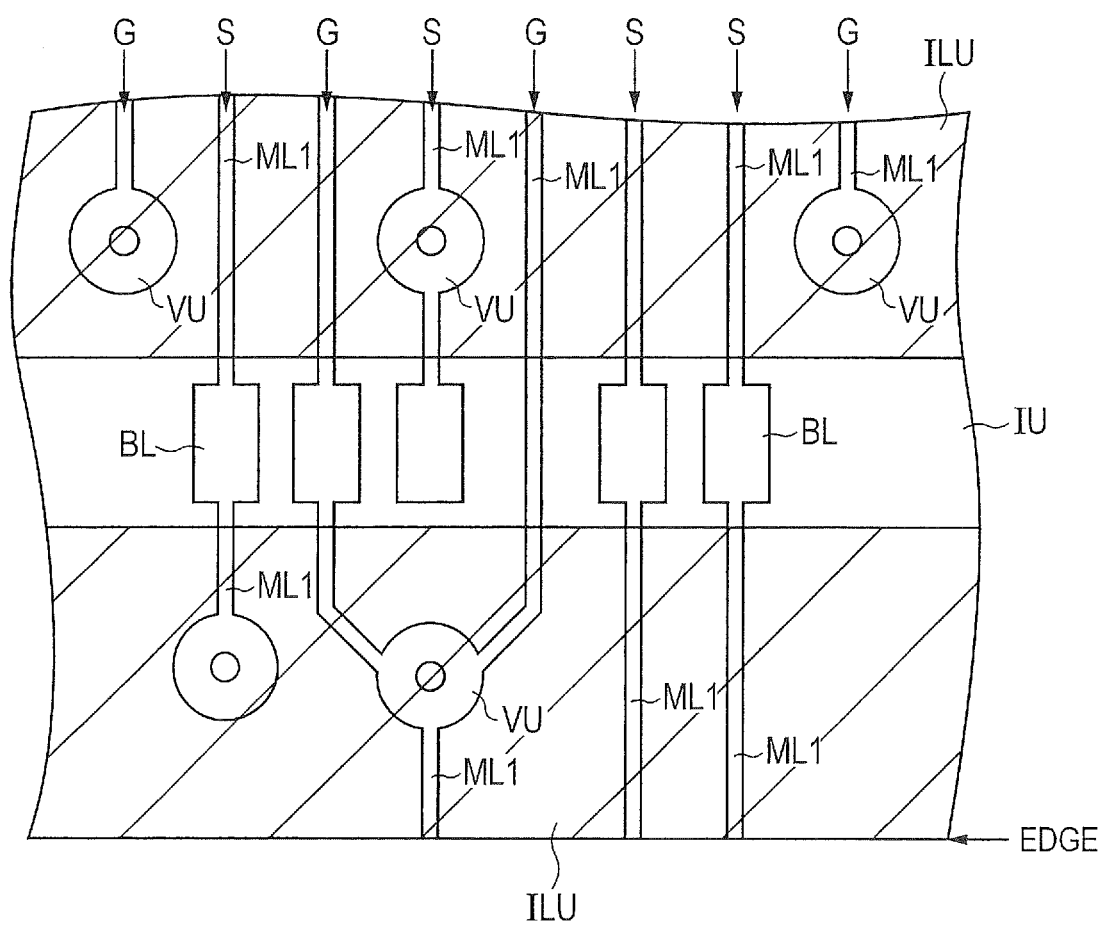
FIG. 8 is an enlarged fragmentary plan view of essential parts of bonding pad groups formed on the upper surface of the interconnection substrate according to the embodiment.

The interconnection substrate IS (package substrate) according to this embodiment will be described referring to FIGS. 4 to 8. FIG. 4 is a plan view of an essential part of the front surface (first surface) of the upper insulating layer of the interconnection substrate according to this embodiment. FIG. 5 is a plan view of an essential part of the front surface (second surface) of the core material (base material) of the interconnection substrate according to this embodiment. FIG. 6 is a plan view of an essential part of the back surface (third surface) of the core material (base material) of the interconnection substrate according to this embodiment. FIG. 7 is a plan view of an essential part of the surface (fourth surface) of the lower insulating layer of the interconnection substrate according to this embodiment. FIG. 8 is an enlarged fragmentary plan view of essential parts of bonding pads formed on the upper surface of the interconnection substrate.

As mentioned earlier, in this embodiment, an interconnection substrate for flip chip bonding cannot be used as it is because a semiconductor chip SC originally designed for flip chip bonding is used for wire bonding.

For this reason, in this embodiment, the layout of the wiring layer (the uppermost wiring layer of the interconnection substrate IS as shown in FIGS. 2 and 3) ML1 formed on the front surface (first surface) of the insulating layer IU of the interconnection substrate IS and the layout of the wiring layer (third wiring layer from top of the interconnection substrate IS as shown in FIGS. 2 and 3) ML3 formed on the back surface (third surface) Cy of the core material C are modified so that a flip-chip-bonded product and a wire-bonded product are the same in terms of the positions of input and output signals of the semiconductor device SM. Furthermore, in order to prevent interference between the wiring layer ML1 formed on the front surface (first surface) of the insulating layer IU of the interconnection substrate IS and the wiring layer ML3 formed on the back surface Cy of the core material C (countermeasure against noise), GND wirings are formed in the wiring layer (second wiring layer from top of the interconnection substrate IS as shown in FIGS. 2 and 3) ML2 formed on the front surface (second surface) Cx of the core material C.

In the explanation given below with reference to FIGS. 4 to 7, the line connecting the center of the third side L3 and the center of the fourth side L4 of the interconnection substrate IS is assumed to be a virtual centerline (which overlaps the virtual centerline CL of the semiconductor chip SC in this embodiment) and the area of the interconnection substrate IS between the first side L1 and the virtual centerline is referred to as a first area A1 and the area of the interconnection substrate IS between the second side L2 and the virtual centerline is referred to as a second area A2. The direction along the virtual centerline of the interconnection substrate IS (direction from the third (fourth) side to the fourth (third) side) is referred to as a y direction and the direction orthogonal to the y direction on the upper surface ISx of the interconnection substrate IS (the front surface Cx of the core material C, the back surface Cy of the core material C, and the lower surface ISy of the interconnection substrate IS) is referred to as an x direction.

FIG. 4 shows the planar layout of the wiring layer ML1 formed on the front surface (first surface) of the insulating film IU of the interconnection substrate IS.

The wiring layer ML1 is used to correct wiring misalignment in the x direction which occurs mainly due to the use of a semiconductor chip originally designed for flip chip bonding.

Since the semiconductor chip SC originally designed for flip chip bonding is used for wire bonding, some signals received by external terminals SB in the second area A2 of the interconnection substrate IS must be sent to the first bonding pad group GBL1 and the second bonding pad group GBL2 in the first area A1. Also, some signals received by external terminals SB in the first area A1 of the interconnection substrate IS must be sent to the third bonding pad group GBL3 and the fourth bonding pad group GBL4 in the second area A2. Conversely, some signals sent from the semiconductor chip SC to the first bonding pad group GBL1 and second bonding pad group GBL2 in the first area A1 must be sent to external terminals SB in the second area A2 of the interconnection substrate IS. Also, some signals sent from the semiconductor chip SC to the third bonding pad group GBL3 and fourth bonding pad group GBL4 in the second area A2 must be sent to external terminals SB in the first area A1 of the interconnection substrate IS.

For this reason, relatively long wirings ML1 are formed in the x direction to couple bonding pads BL of the first bonding pad group GBL1 or second bonding pad group GBL2 in the first area A1 with through holes VU in the second area A2 respectively. Similarly, relatively long wirings ML1 are formed in the x direction to couple bonding pads BL of the third bonding pad group GBL3 or fourth bonding pad group GBL4 in the second area A2 with through holes VU in the first area A1 respectively. Consequently, the front surface of the insulating layer IU has an area in which wirings ML1 extending from bonding pads BL in the first area A1 to the second area A2 respectively and wirings ML1 extending from some bonding pads BL in the second area A2 to the first area respectively are adjacent to each other.

The wiring layer ML1 is generally made by electroplating. Therefore, electrodes for plating (not shown) are formed on the first side L1 and second side L2 of the interconnection substrate IS and wirings ML1 to couple bonding pads BL and the electrodes for plating are also formed on the front surface of the insulating layer IU.

FIG. 5 shows the planar layout of the wiring layer (GND wiring layer) ML2 formed on the front surface (second surface) of the core material C.

The wiring layer (GND wiring layer) ML2 which lies between the wiring layer ML1 formed on the front surface of the insulating layer IU and the wiring layer ML3 formed on the back surface Cy of the core material C prevents interference between the wiring layer ML1 and wiring layer ML3 and makes transmission of noise from outside difficult so that the power supply is stabilized.

FIG. 6 shows the planar layout of the wiring layers ML3 formed on the back surface Cy of the core material C (third surface).

The wiring layer ML3 on the back surface Cy of the core material C is used to correct wiring misalignment in the y direction which occurs mainly due to the use of a semiconductor chip originally designed for flip chip bonding.

It is difficult to use the interconnection substrate originally designed for flip chip bonding as an interconnection substrate for wire bonding merely by modifying the wiring layer ML1 extending in the x direction. For this reason, the wiring layer ML3 formed on the back surface Cy of the core material C is used to correct wiring misalignment in the y direction.

FIG. 7 shows the planar layout of the wiring layer ML4 formed on the surface of the insulating layer ID (fourth surface) of the interconnection substrate IS.

A plurality of lowermost wirings ML4 are formed on the surface of the insulating layer ID of the interconnection substrate IS and some of them serve as bump lands BLR.

As shown above in FIG. 4, on the front surface of the insulating layer IU of the interconnection substrate IS, relatively long wirings ML1 are formed to couple bonding pads BL of the first bonding pad group GBL1 or second bonding pad group GBL2 in the first area A1 with through holes VU in the second area A2. Similarly, relatively long wirings ML1 are formed to couple bonding pads BL of the third bonding pad group GBL3 or fourth bonding pad group GBL4 in the second area A2 with through holes VU in the first area A1.

It is a usual practice to use short wirings for signals with large noise. Alternatively, crosstalk (phenomenon that current flows between uncoupled wirings) is prevented by avoiding locating wirings near a circuit susceptible to noise. However, the wirings ML1 are relatively long, so crosstalk may occur. Therefore, in a wiring region in which the influence of noise should be prevented, GND wirings are located on both sides of a signal wiring to make a coplanar line.

Therefore, as shown in FIG. 8, among the bonding pads BL, some bonding pads BL joined to GND wirings G are located on both sides of, and spaced from, a bonding pad BL joined to a signal wiring S.

As mentioned above, in the semiconductor device according to this embodiment, a semiconductor chip originally designed for flip chip bonding can be used to assemble a semiconductor device by a wire bonding process. This reduces the cost of assembling a semiconductor product. In addition, the positions of external terminals SB formed on the lower surface ISy of the interconnection substrate IS on which the semiconductor chip SC is mounted is the same between a semiconductor device assembled by a flip chip bonding process and a semiconductor device assembled by a wire bonding process, so that they are the same in terms of the positions of input and output signals. This means that the same substrate on which a semiconductor device is mounted can be used for the semiconductor device assembled by a flip chip bonding process and the semiconductor device assembled by a wire bonding process without modifying the arrangement of wirings, etc. of the substrate.

When the semiconductor chip SC originally designed for flip chip bonding is used to assemble a semiconductor product by a wire bonding process, relatively long conductive wires CW must be used, posing the problem of crosstalk. However, this problem can be prevented by adopting a coplanar line. Furthermore, the presence of the GND wiring layer (wiring layer ML2 formed on the front surface (second surface) Cx of the core material C) between the front surface (first surface) of the insulating layer IU and the back surface (third surface) of the core material C of the interconnection substrate IS prevents interference between the wiring layer ML1 formed on the front surface (first surface) of the insulating layer IU and the wiring layer ML3 formed on the back surface (third surface) of the core material C.

Method of Manufacturing a Semiconductor Device

In the semiconductor chip originally designed for flip chip bonding, a plurality of electrode pads is arranged not only in the peripheral areas (inside the edges of the semiconductor chip) of the semiconductor chip but also in its central area. Therefore, the conductive wires which couple the bonding pads located in the central area of the semiconductor chip with the bonding pads on the main surface of the interconnection substrate IS are longer than the conductive wires which couple the electrode pads located in the peripheral areas of the semiconductor chip with the bonding pads on the main surface of the interconnection substrate IS. When the conductive wires are long, wire sweep may occur in resin-sealing the semiconductor chip and conductive wires and neighboring conductive wires may contact each other.

The present inventors investigated the possibility of using high-fluidity resin for resin sealing. However, the following problem has been found: in a multi-chip interconnection substrate in which a plurality of semiconductor chips are resin-sealed, the resin-sealed portions warp and become convex and as a consequence the resin-sealed multi-chip substrate cannot be placed in a conveyance cassette. In this embodiment, in order to reduce the warpage of the multi-chip interconnection substrate, each semiconductor chip is mounted in a chip mounting area of the upper surface of the multi-chip interconnection substrate in a way that the long sides of the multi-chip interconnection substrate are parallel to the short sides of the semiconductor chip.

Figure 9:
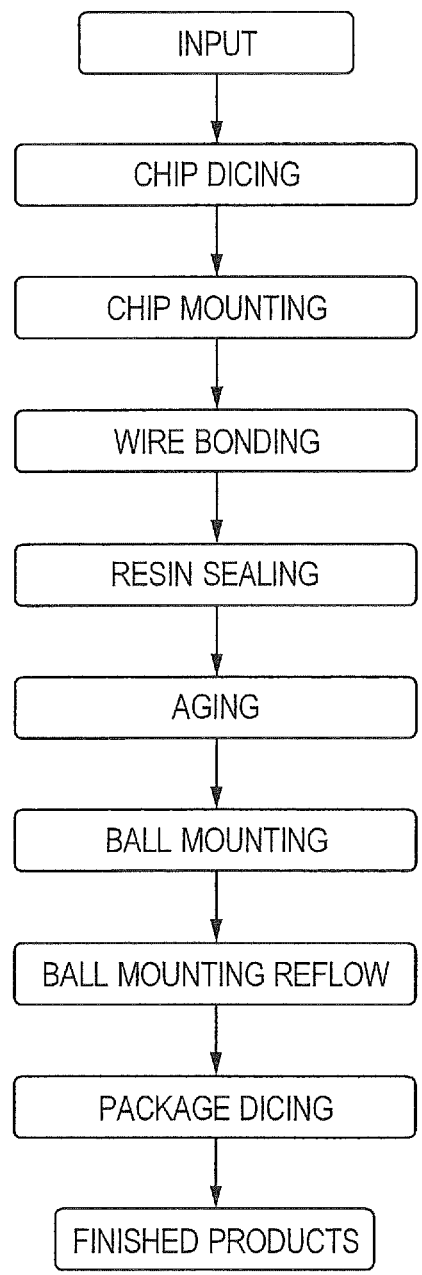
FIG. 9 is a flowchart illustrating the sequence of assembling a semiconductor device according to the embodiment.
Figure 15:
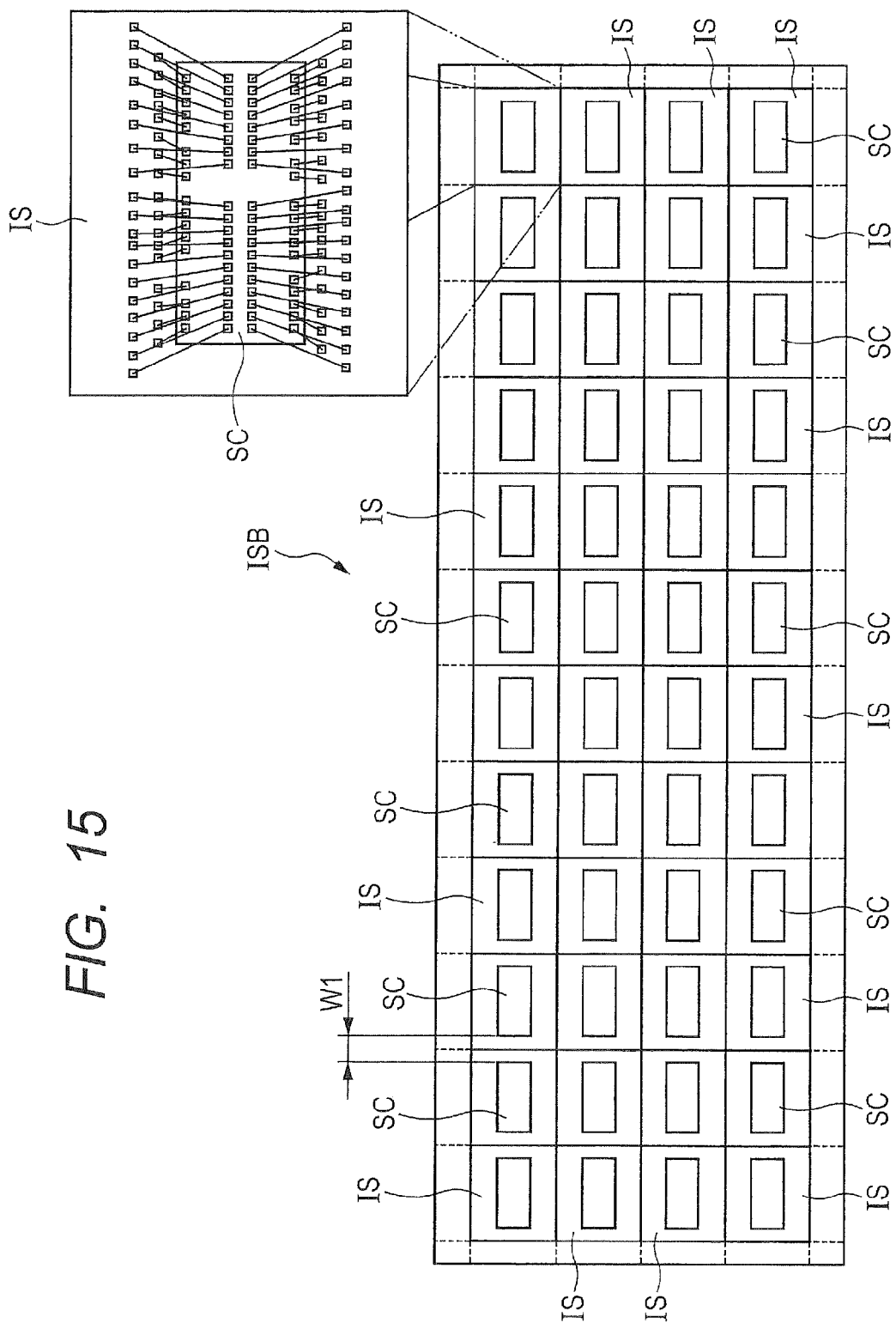
FIG. 15 is a plan view of an essential part of the resin-sealed multi-chip interconnection substrate with a plurality of semiconductor chips mounted thereon, which the present inventors examined as a comparative example, as seen through a resin sealing body.
Figure 16:
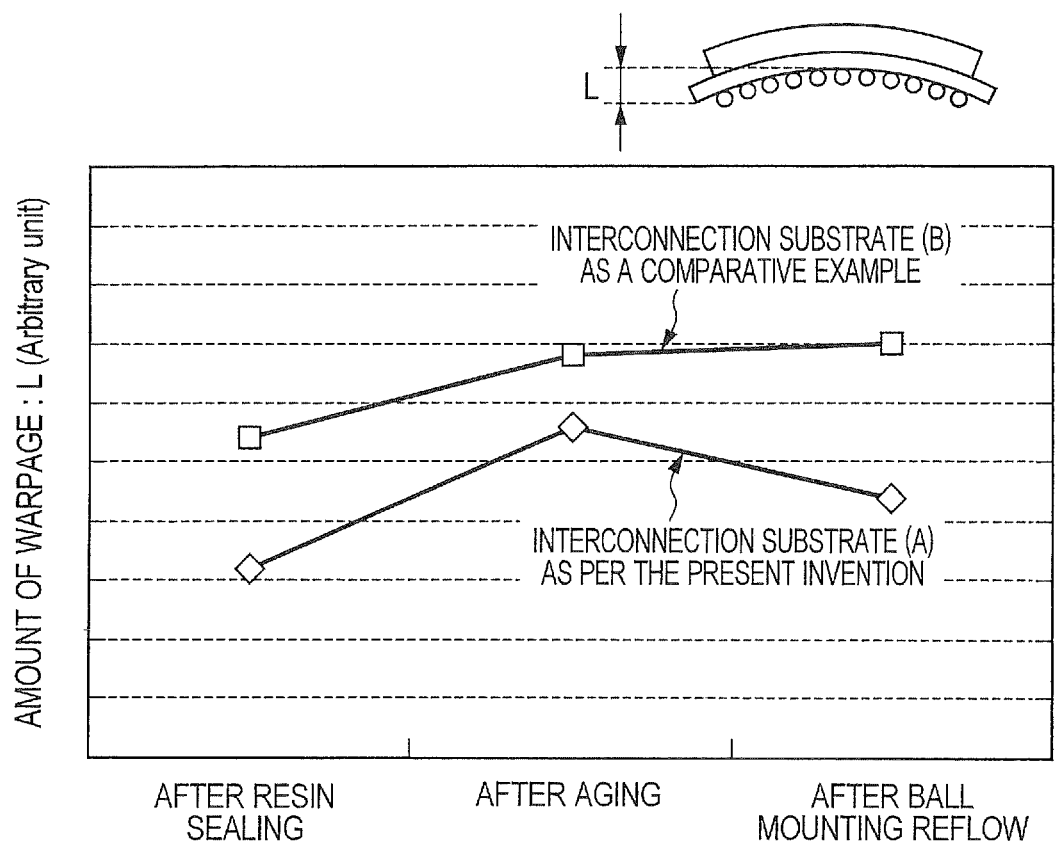
FIG. 16 is a graph which shows the amount of warpage of the multi-chip interconnection substrate according to the embodiment.

The process of assembling a semiconductor device according to this embodiment will be described in sequential order, referring to FIGS. 9 to 18. FIG. 9 is a flowchart illustrating the sequence of assembling a semiconductor device according to this embodiment. FIGS. 10, 12, 13, 17, and 18 are sectional views of essential parts of the semiconductor devices, illustrating individual steps of assembling a semiconductor device according to this embodiment. FIG. 11 is a plan view of an essential part of the multi-chip interconnection substrate with a plurality of semiconductor chips according to this embodiment mounted thereon. FIG. 14 is a plan view of an essential part of the multi-chip interconnection substrate with a plurality of semiconductor chips according to this embodiment mounted thereon, illustrating the resin-sealed multi-chip interconnection substrate as seen through the resin sealing body. FIG. 15 is a plan view of an essential part of the multi-chip interconnection substrate with a plurality of semiconductor chips mounted thereon, which the present inventors examined as a comparative example, illustrating the resin-sealed interconnection substrate as seen through the resin sealing body. FIG. 16 is a graph which shows the amount of warpage of the multi-chip interconnection substrates.

Chip Dicing Step

First, a semiconductor wafer is prepared. In each chip area of the main surface of the semiconductor wafer, a plurality of semiconductor elements are formed. Then, the main surface of the semiconductor wafer and its back surface are polished to attain the prescribed thickness of the semiconductor wafer.

Next, the upper surface of the dicing tape and the back surface of the semiconductor wafer are made to face each other and both joined together through a resin sheet. Then, the semiconductor wafer and the resin sheet are cut vertically and horizontally along the scribe lines, for example, using a ultrathin circular blade with fine diamond grains attached. The semiconductor wafer is diced into individual semiconductor chips, though the individual semiconductor chips are fixed on the frame through the dicing tape and remain aligned.

Chip Mounting Step

Figure 10:
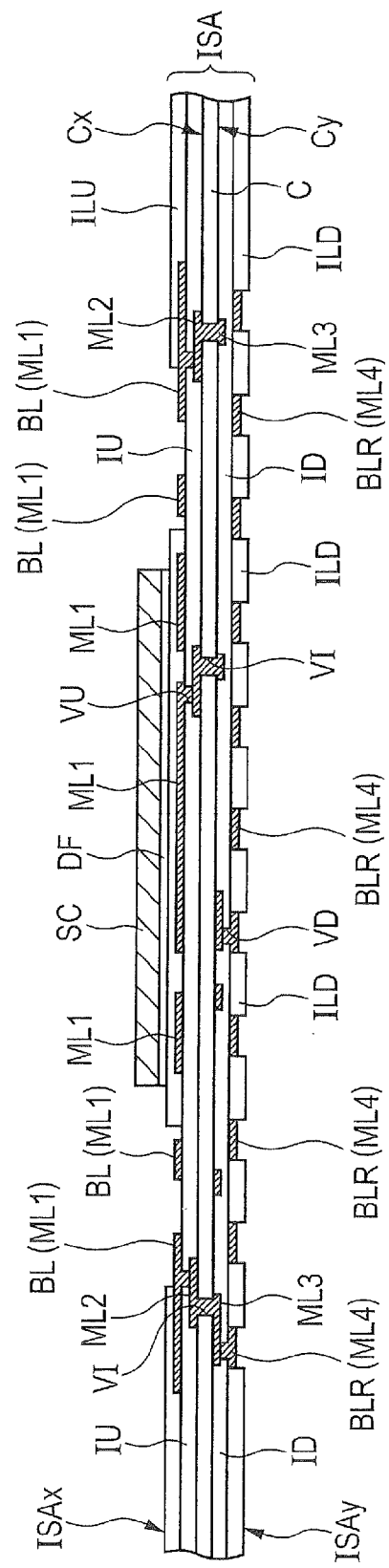
FIG. 10 is a sectional view of an essential part of the semiconductor device at a step of a semiconductor device assembling step according to the embodiment.
Figure 11:
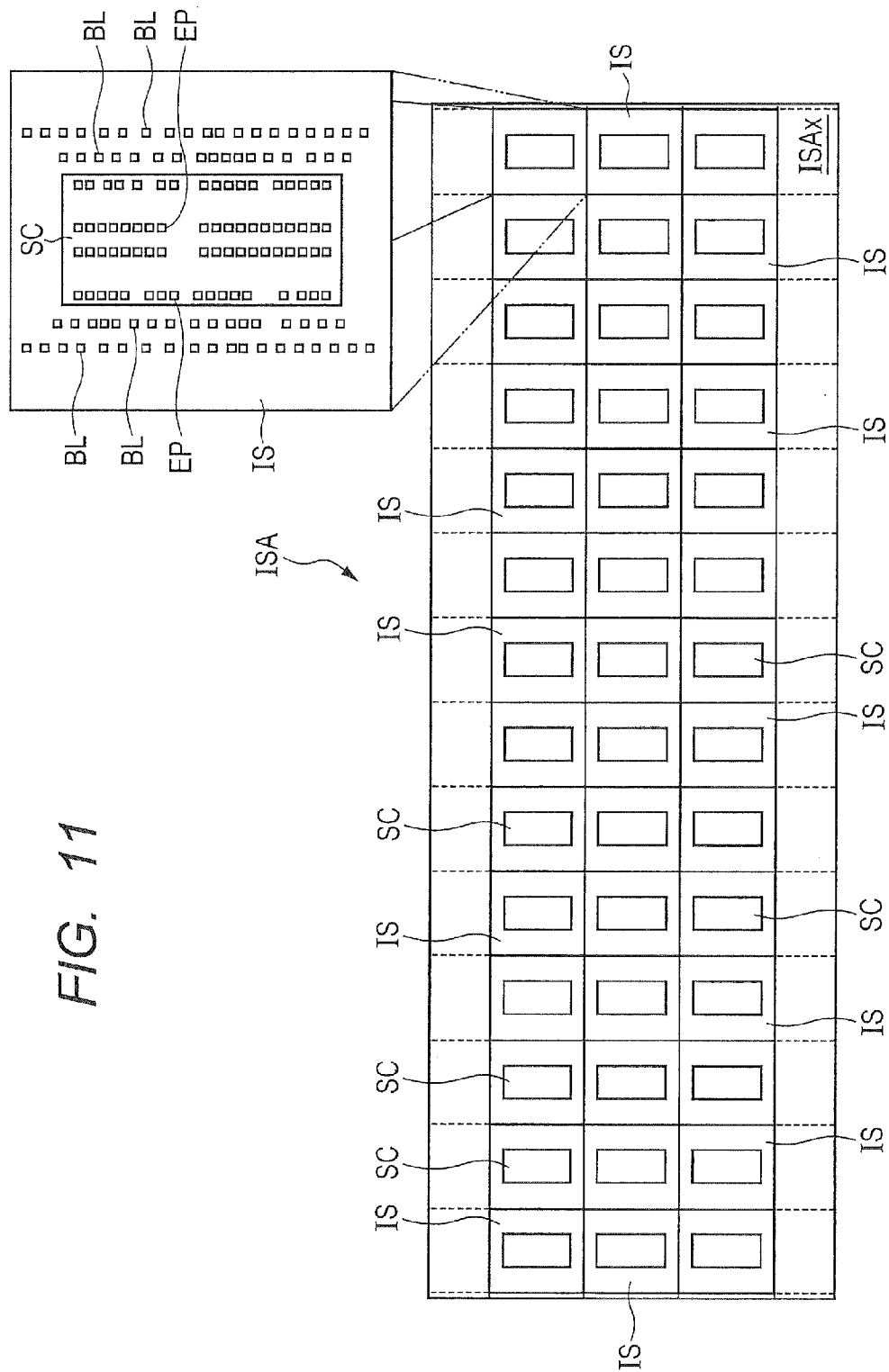
FIG. 11 is a plan view of an essential part of a multi-chip interconnection substrate with a plurality of semiconductor chips mounted thereon according to the embodiment.

Next, as shown in FIGS. 10 and 11, a multi-chip interconnection substrate ISA having a plurality of chip mounting areas where semiconductor chips are mounted is prepared. In the multi-chip interconnection substrate ISA, its plane intersecting its thickness direction has a quadrangular (rectangular) shape composed of two long sides and two short sides, in which blocks, each of which is an area (which corresponds to the interconnection substrate IS described above with reference to FIGS. 1 to 3) where one semiconductor chip is mounted, are arranged in a matrix pattern on the substrate. FIG. 11 shows an example of the multi-chip interconnection substrate ISA where interconnection substrates IS are arranged 3 rows by 14 columns.

The multi-chip interconnection substrate ISA has a matrix pattern of interconnection substrates IS as mentioned above and the long sides of the multi-chip interconnection substrate ISA are intersecting the direction in which the bonding pads BL of the first bonding pad group GBL1, second bonding pad group GBL2, third bonding pad group GBL3 and fourth bonding pad group GBL4 are arranged in a row.

Next, each semiconductor chip SC is peeled off the dicing tape and picked up. The picked-up semiconductor chip SC is conveyed to a prescribed chip mounting area of the upper surface (main surface, front surface) of the multi-chip interconnection substrate ISA. Then, the resin agent DF attached to the back surface of the semiconductor chip SC and the protective film ILU of the chip mounting area of the multi-chip interconnection substrate ISA are made to face each other and heat and pressure are applied to bond the semiconductor chip SC to the chip mounting area of the multi-chip interconnection substrate ISA.

The multi-chip interconnection substrate ISA has long sides and short sides perpendicular to the long sides and each semiconductor chip SC is mounted in a chip mounting area of the multi-chip interconnection substrate ISA in a way that the long sides of the multi-chip interconnection substrate ISA are parallel to the short sides of the semiconductor chip SC. When the semiconductor chip SC is mounted in a chip mounting area of the multi-chip interconnection substrate ISA in this way, warpage of the resin sealing body RS is reduced as described later. The effect will be explained in detail in the description of a subsequent step, for example, the sealing step.

Wire Bonding Step

Figure 12:
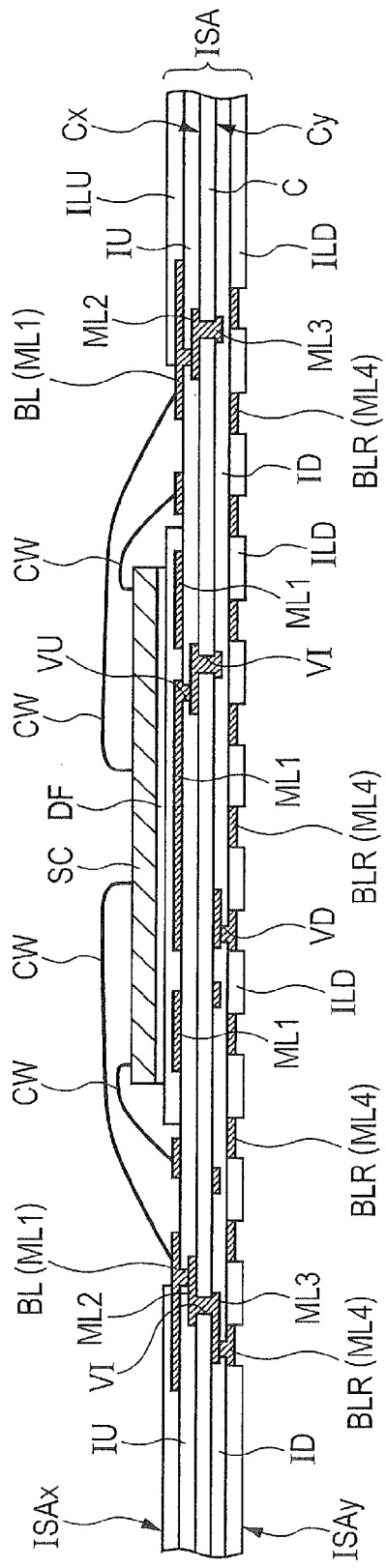
FIG. 12 is a sectional view of the same part of the semiconductor device as shown in FIG. 10 at a semiconductor device assembling step subsequent to the steps in FIGS. 10 and 11.

Next, as shown in FIG. 12, the electrode pads EP (see FIG. 1) exposed on the main surface of the semiconductor chip SC are electrically coupled with the bonding pads BL formed around the chin mounting area of the multi-chip interconnection substrate ISA using conductive wires CW respectively, for example, by a nail head bonding process (ball bonding) as a combination of thermal compression and ultrasonic oscillation. The conductive wires CW are, for example, gold wires with a diameter of 23 microns.

The forward bonding process (an electrode pad EP of the semiconductor chip SC is first coupled with part of a conductive wire CW and then a bonding pad BL is coupled with the other part of the conductive wire CW) is usually used, but instead the reverse bonding process (a bonding pad BL is first coupled with part of a conductive wire CW and then an electrode pad EP of the semiconductor chip SC is coupled with the other part of the conductive wire CW) may be used.

Resin Sealing Step (Molding Step)

Figure 13:
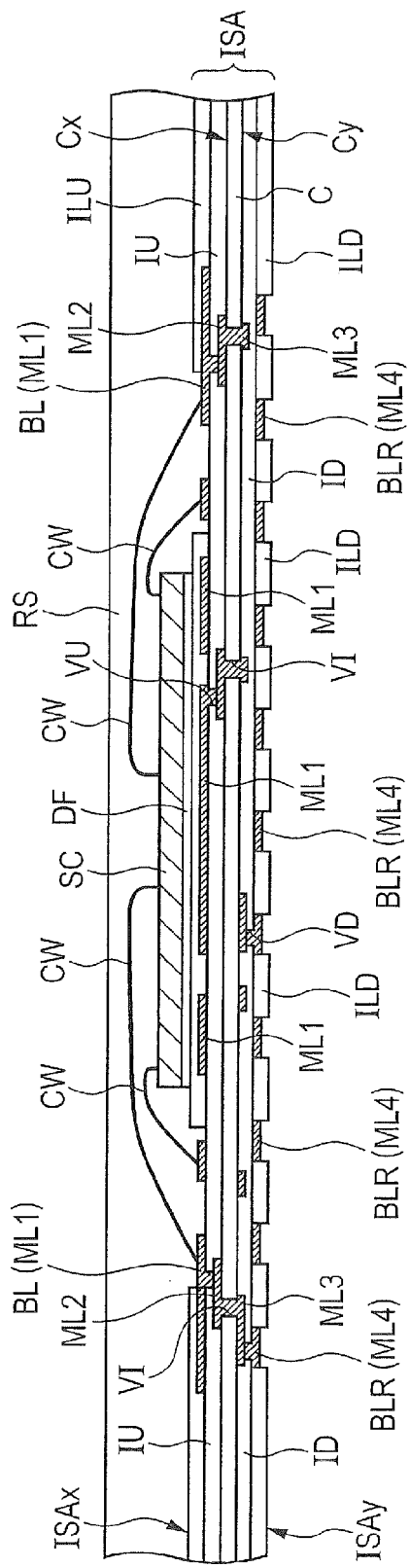
FIG. 13 is a sectional view of the same part of the semiconductor device as shown in FIG. 10 at a semiconductor device assembling step subsequent to the step in FIG. 12.
Figure 14:
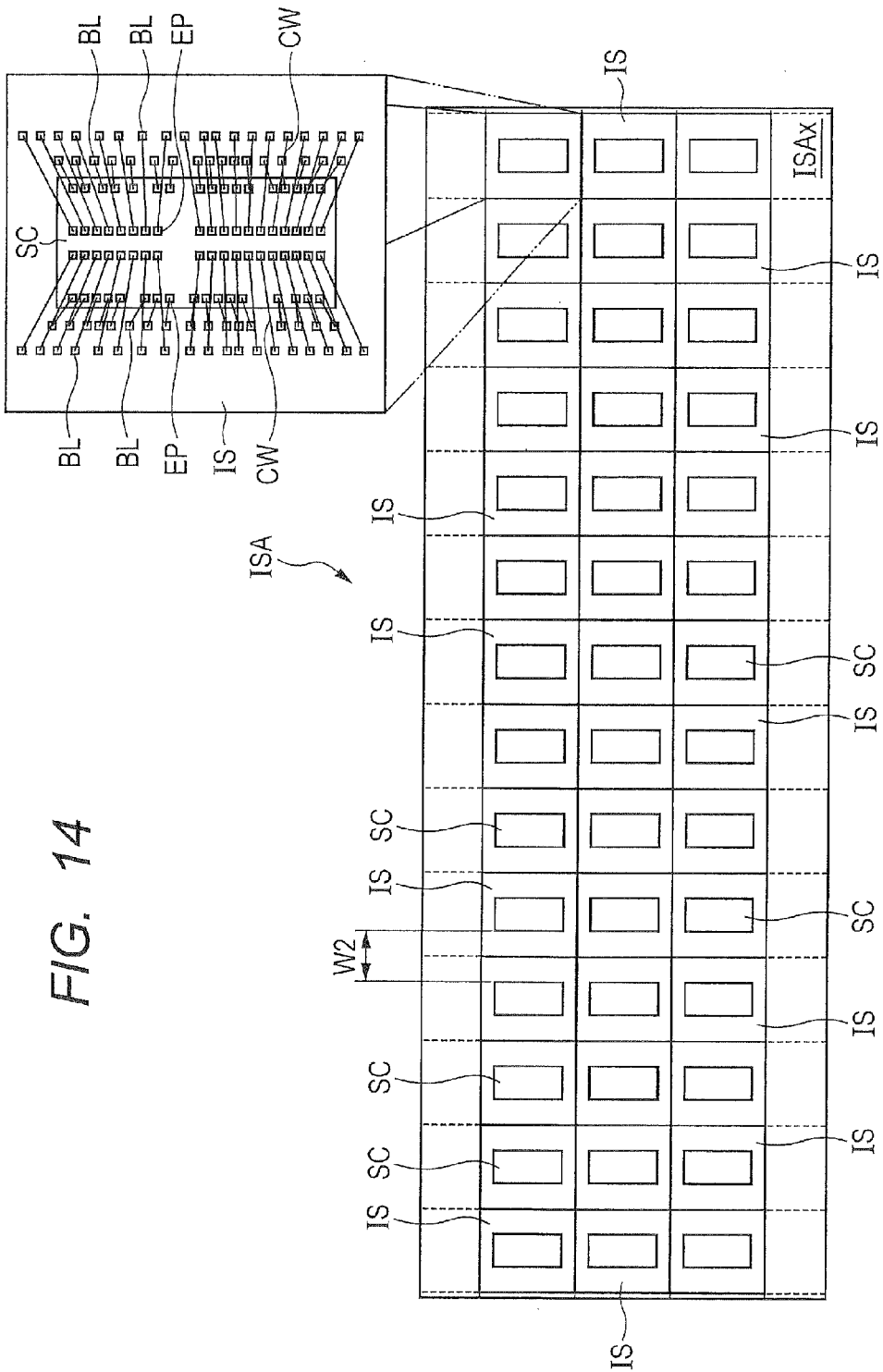
FIG. 14 is a plan view of an essential part of the resin-sealed multi-chip interconnection substrate with a plurality of semiconductor chips mounted thereon according to the embodiment, as seen through a resin sealing body.

Next, as shown in FIGS. 13 and 14, only the upper surface ISAx of the multi-chip interconnection substrate ISA with semiconductor chips SC mounted thereon is sealed by a resin sealing body RS (FIG. 14 shows the substrate seen through the resin sealing body RS). For example, a molding apparatus with a mold is used for sealing. First, the multi-chip interconnection substrate ISA with semiconductor chips SC mounted thereon is placed in the lower half mold of the molding apparatus. Then, after the multi-chip interconnection substrate ISA is fixed by the upper and lower half molds, a resin tablet is heated by a preheater to decrease the resin viscosity and the liquefied sealing resin is pressure-fed into the mold. Then, the sealing resin filled in the mold is cured by polymerization reaction and the upper and lower half molds are opened to pick up the multi-chip interconnection substrate ISA covered by the sealing resin.

In order to achieve high fluidity, for example, epoxy thermosetting insulating resin to which a phenol cure agent and a high mass fraction (for example, 80 to 90%) of filler (for example, molten silica) are added is used as the sealing resin. The fluidity of the sealing resin used as measured by a spiral flow mold is 100 cm or more.

In this embodiment, high-fluidity resin with a large contractile force is used in order to prevent conductive wires CW from contacting each other due to wire sweep. At the aging step after the sealing step, heating is performed. In the cooling process after this heating process, the lower surface ISAy of the multi-chip interconnection substrate ISA first cools down. This is because the radiation efficiency of the lower surface (mounting surface, back surface) ISAy of the multi-chip interconnection substrate ISA which is not covered by the high-fluidity resin is higher than that of the upper surface ISAx of the multi-chip interconnection substrate ISA covered by the high-fluidity resin. After that, first the high-fluidity resin on the multi-chip interconnection substrate ISA side gradually cools down and hardens, so the multi-chip interconnection substrate ISA is considered to warp because the contraction of the high-fluidity resin on the multi-chip interconnection substrate ISA side is larger than that of the high-fluidity resin on the opposite side of the multi-chip interconnection substrate ISA.

FIG. 15 is a plan view of an essential part of the multi-chip interconnection substrate with semiconductor chips mounted thereon, which the present inventors examined as a comparative example, illustrating the resin-sealed interconnection substrate as seen through the resin sealing body.

Like the multi-chip interconnection substrate ISA described above with reference to FIGS. 11 and 14, the multi-chip interconnection substrate ISB has a plane perpendicular to its thickness direction which has a quadrangular (rectangular) shape composed of long sides and short sides, in which blocks, each of which is an area where one semiconductor chip is mounted, are arranged in a matrix pattern. Each semiconductor chip SC is mounted in a chip mounting area of the multi-chip interconnection substrate ISB in a way that the long sides of the multi-chip interconnection substrate ISB are parallel to the long sides of the semiconductor chip SC.

However, when the semiconductor chips SC are mounted in this way, the interval (W1) between neighboring semiconductor chips SC arranged in the long side direction of the multi-chip interconnection substrate ISB is relatively small. Therefore, the semiconductor chips SC arranged in the long side direction of the multi-chip interconnection substrate ISB are considered to cause the multi-chip interconnection substrate ISB to warp easily.

Therefore, in this embodiment, as shown in FIGS. 11 and 14, each semiconductor chip SC is mounted in a chip mounting areas of the multi-chip interconnection substrate ISA in a way that the long sides of the multi-chip interconnection substrate ISA are parallel to the short sides of the semiconductor chip SC. When semiconductor chips SC are arranged in this way, the interval (W2) between neighboring semiconductor chips SC arranged in the long side direction of the multi-chip interconnection substrate ISA is larger than when each semiconductor chip SC is mounted in a way that the long sides of the multi-chip interconnection substrate ISB are parallel to the long sides of the semiconductor chip SC. Consequently the multi-chip interconnection substrate ISA hardly warps. When the long sides of the multi-chip interconnection substrate ISA are parallel to the short sides of the semiconductor chip SC, the amount of sealing resin is increased, which also contributes to reducing the warpage of the multi-chip interconnection substrate ISA.

FIG. 16 shows the amount of warpage (A) of the multi-chip interconnection substrate with semiconductor chips mounted thereon after resin sealing in which the long sides of the multi-chip interconnection substrate are parallel to the short sides of the semiconductor chips and the amount of warpage (B) of the multi-chip interconnection substrate with semiconductor chips mounted thereon after resin sealing in which the long sides of the multi-chip interconnection substrate are parallel to the long sides of the semiconductor chips.

It is known from the graph that the amount of warpage of the multi-chip interconnection substrate with semiconductor chips mounted thereon after resin sealing in which the long sides of the substrate are parallel to the short sides of the semiconductor chips (for example, the multi-chip interconnection substrate ISA shown in FIGS. 11 and 14) is about half of the amount of warpage of the multi-chip interconnection substrate with semiconductor chips mounted thereon after resin sealing in which the long sides of the substrate are parallel to the long sides of the semiconductor chips (for example, the multi-chip interconnection substrate ISB shown in FIG. 15).

Aging Step

Next, the unnecessary sealing resin is removed and heat treatment (quenching, post-cure baking) is carried out, for example, at 175° C. for 2 to 8 hours to complete polymerization reaction. Consequently some portions of the semiconductor chips SC (upper and side surfaces) and the conductive wires CW are sealed by the resin sealing body RS covering the upper surface ISAx of the multi-chip interconnection substrate ISA.

FIG. 16 shows the amount of warpage (A) of the multi-chip interconnection substrate with semiconductor chips mounted thereon after aging in which the long sides of the multi-chip interconnection substrate are parallel to the short sides of the semiconductor chips and the amount of warpage (B) of the multi-chip interconnection substrate with semiconductor chips mounted thereon after aging in which the long sides of the multi-chip interconnection substrate are parallel to the long sides of the semiconductor chips.

The heat treatment process increases the amount of warpage of the multi-chip interconnection substrate with semiconductor chips mounted thereon in which the long sides of the substrate are parallel to the short sides of the semiconductor chips and that of the multi-chip interconnection substrate with semiconductor chips mounted thereon in which the long sides of the multi-chip interconnection substrate are parallel to the long sides of the semiconductor chips. Nevertheless, the amount of warpage of the multi-chip interconnection substrate with semiconductor chips mounted thereon in which the long sides of the substrate are parallel to the short sides of the semiconductor chips is smaller than that of the multi-chip interconnection substrate with semiconductor chips mounted thereon in which the long sides of the substrate are parallel to the long sides of the semiconductor chips.

Ball Mounting Step and Ball Mounting Reflow Step

Figure 17:
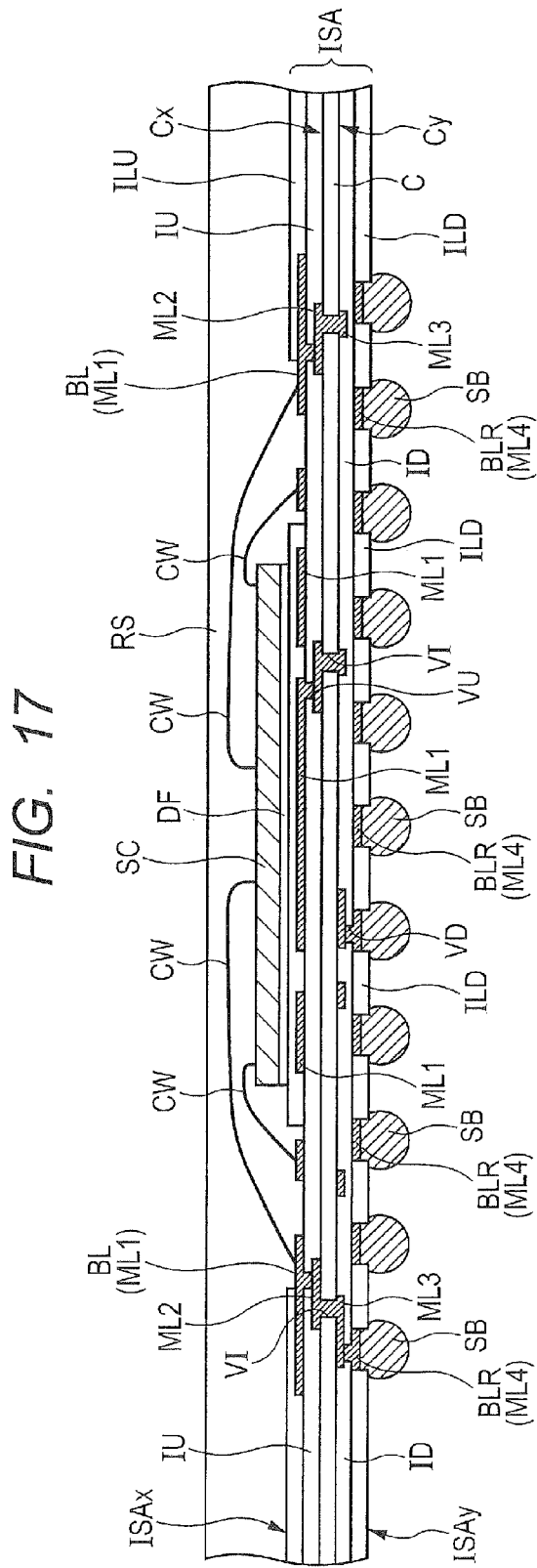
FIG. 17 is a sectional view of the same part of the semiconductor device as shown in FIG. 10 at a semiconductor device assembling step subsequent to the steps in FIGS. 13 and 14.

Next, as shown in FIG. 17, external terminals SB are joined to bump lands BLR formed on the surface of the insulating layer ID of the multi-chip interconnection substrate ISA respectively. The external terminals SB are formed, for example, by supplying solder balls by a ball supply method and conducting heat treatment. This heat treatment is conducted at 200° C. or more, for example, 240 to 250° C., for several seconds.

FIG. 16 shows the amount of warpage (A) of the multi-chip interconnection substrate with semiconductor chips mounted thereon after ball mounting reflow in which the long sides of the multi-chip interconnection substrate are parallel to the short sides of the semiconductor chips and the amount of warpage (B) of the multi-chip interconnection substrate with semiconductor chips mounted thereon after ball mounting reflow in which the long sides of the multi-chip interconnection substrate are parallel to the long sides of the semiconductor chips.

The heat treatment process slightly increases the amount of warpage of the multi-chip interconnection substrate with semiconductor chips mounted thereon in which the long sides of the substrate are parallel to the long sides of the semiconductor chips. By contrast, in the multi-chip interconnection substrate with semiconductor chips mounted thereon in which the long sides of the substrate are parallel to the short sides of the semiconductor chips, the amount of warpage after heat treatment is smaller than after aging. The reason may be that the ball mounting reflow step partially relieves the stress applied from the resin sealing body to the multi-chip interconnection substrate.

Package Dicing Step

Figure 18:
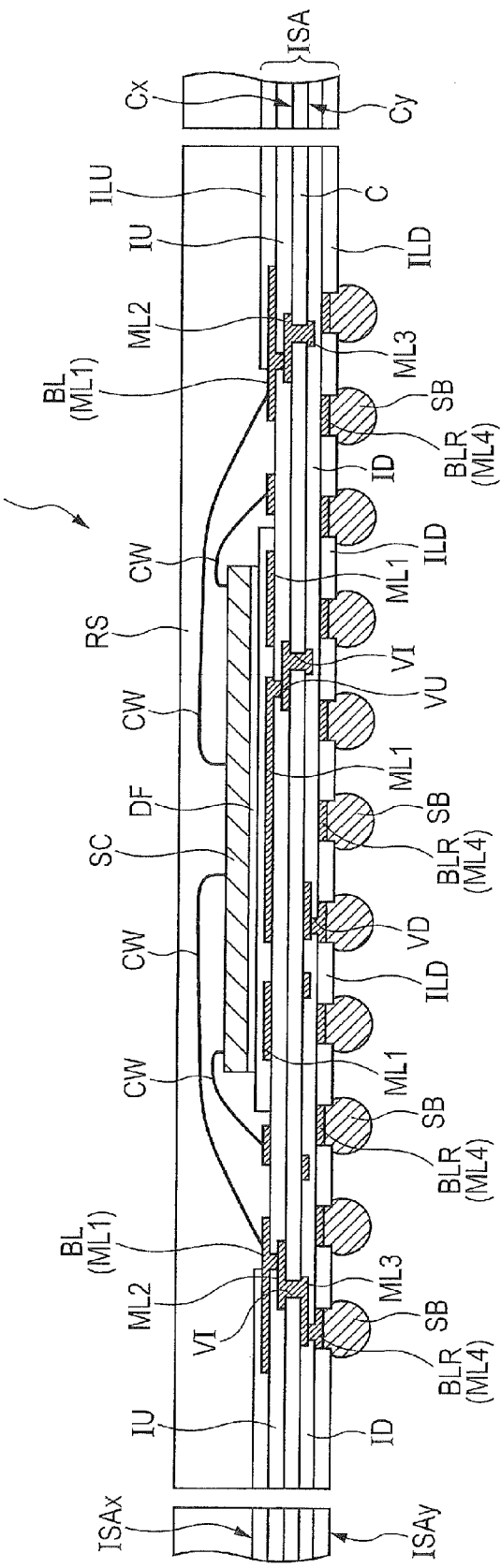
FIG. 18 is a sectional view of the same part of the semiconductor device as shown in FIG. 10 at a semiconductor device assembling step subsequent to the step in FIG. 17.

Next, as shown in FIG. 18, the multi-chip interconnection substrate ISA is diced along dicing lines into individual semiconductor devices SM. Then, they are screened in accordance with the product specification and subjected to final appearance inspection to obtain finished products (semiconductor devices SM).

When the semiconductor chip SC originally designed for flip chip bonding is used to assemble a semiconductor product by a wire bonding process, relatively long conductive wires CW must be used. As discussed above, in the method of manufacturing a semiconductor device according to this embodiment, even though high-fluidity resin is used as the sealing resin in order to prevent contact between neighboring conductive wires CW, warpage of the multi-chip interconnection substrate ISA with resin-sealed semiconductor chips is reduced by mounting the semiconductor chips SC in the chip mounting areas of the upper surface ISAx of the substrate ISA in a way that the long sides of the substrate ISA are parallel to the short sides of the semiconductor chips SC.

The invention made by the present inventors has been so far concretely explained in reference to the preferred embodiment thereof. However, the invention is not limited to the above embodiment and it is obvious that these details may be modified in various ways without departing from the spirit and scope of the invention.

In the above embodiment, the bonding pads of each of the first, second, third, and fourth bonding pad groups are arranged in a row; however the invention is not limited thereto. In each bonding pad group, the bonding pads maybe arranged, for example, in a staggered pattern. Similarly, in the above embodiment, the electrode pads of each of the first, second, third, and fourth electrode pad groups are arranged in a row; however the invention is not limited thereto. In each electrode pad group, the electrode pads may be arranged, for example, in a staggered pattern.

In the above embodiment, the first electrode pad group and third electrode pad group are symmetrical with respect to the virtual centerline and the second electrode pad group and fourth electrode pad group are symmetrical with respect to the virtual centerline. Also the first bonding pad group and third bonding pad group are symmetrical with respect to the virtual centerline and the second bonding pad group and fourth bonding pad group are symmetrical with respect to the virtual centerline. However the invention is not limited thereto.

What is claimed is:

1. A semiconductor device comprising:
an interconnection substrate having an upper surface and a lower surface opposite to the upper surface; and
a semiconductor chip having a main surface and a back surface opposite to the main surface and being mounted on the upper surface of the interconnection substrate through a bonding adhesive with the back surface facing the upper surface of the interconnection substrate,
wherein a shape of a plane intersecting a thickness direction of the interconnection substrate comprises a quadrangle having a first side, a second side opposite to the first side, a third side orthogonal to the first side, and a fourth side opposite to the third side;
wherein a shape of a plane intersecting a thickness direction of the semiconductor chip comprises a quadrangle having two opposite long sides and two opposite short sides;

wherein on the upper surface of the interconnection substrate, outside a chip mounting area, a first bonding pad group including a plurality of bonding pads and a second bonding pad group including the bonding pads are formed parallel to the first side of the interconnection substrate between one long side of the semiconductor chip and the first side of the interconnection substrate;

wherein on the upper surface of the interconnection substrate, outside the chip mounting area, a third bonding pad group including the bonding pads and a fourth bonding pad group including the bonding pads are formed parallel to the second side of the interconnection substrate between the other long side of the semiconductor chip and the second side of the interconnection substrate;

wherein on the main surface of the semiconductor chip, a first electrode pad group including a plurality of electrode pads and a second electrode pad group including a plurality of electrode pads are formed parallel to the one long side of the semiconductor chip between a virtual centerline connecting centers of the two short sides of the semiconductor chip and the one long side, in order from the one long side of the semiconductor chip;

wherein on the main surface of the semiconductor chip, a third electrode pad group including a plurality of electrode pads and a fourth electrode pad group including a plurality of electrode pads are formed parallel to the other long side of the semiconductor chip between the virtual centerline and the other long side of the semiconductor chip, in order from the other long side of the semiconductor chip;

wherein the bonding pads of the first bonding pad group and the electrode pads of the first electrode pad group are electrically coupled by a plurality of first conductive wires respectively and the bonding pads of the second bonding pad group and the electrode pads of the second electrode pad group are electrically coupled by a plurality of second conductive wires respectively;

wherein the bonding pads of the third bonding pad group and the electrode pads of the third electrode pad group are electrically coupled by a plurality of third conductive wires respectively and the bonding pads of the fourth bonding pad group and the electrode pads of the fourth electrode pad group are electrically coupled by a plurality of fourth conductive wires respectively, wherein the second conductive wires are longer than the first conductive wires and the fourth conductive wires are longer than the third conductive wires, wherein a distance between the first electrode pad group and the second electrode pad group is greater than a distance between the second electrode pad group and the fourth electrode pad group; and wherein a distance between electrode pads in a central portion of the second electrode pad group is greater than a distance between electrode pads in another portion of the second electrode pad group, and a distance between electrode pads in a central portion of the fourth electrode pad group is greater than a distance between electrode pads in another portion of the fourth electrode pad group.

2. The semiconductor device according to claim 1, wherein the first bonding pad group comprises a plurality of bonding pads arranged in a row, parallel to the first side of the interconnection substrate;

wherein the second bonding pad group comprises the bonding pads arranged in a row, parallel to the first side of the interconnection substrate between the first bonding pad group and the first side of the interconnection substrate;

wherein the third bonding pad group comprises the bonding pads arranged in a row, parallel to the second side of the interconnection substrate; and wherein the fourth bonding pad group comprises the bonding pads arranged in a row, parallel to the second side of the interconnection substrate between the third bonding pad group and the second side of the interconnection substrate.

3. The semiconductor device according to claim 1, wherein the first electrode pad group comprises a plurality of electrode pads arranged in a row, parallel to the one long side of the semiconductor chip and adjacently to the one long side of the semiconductor chip;

wherein the second electrode pad group comprises the electrode pads arranged in a row, parallel to the one long side of the semiconductor chip and adjacently to the virtual centerline of the semiconductor chip between the first electrode pad group and the virtual centerline of the semiconductor chip;

wherein the third electrode pad group comprises the electrode pads arranged in a row, parallel to the other long side of the semiconductor chip and adjacently to the other long side of the semiconductor chip, and wherein the fourth electrode pad group comprises the electrode pads arranged in a row, parallel to the other long side of the semiconductor chip and adjacently to the virtual centerline of the semiconductor chip between the third electrode pad group and the virtual centerline of the semiconductor chip.

4. The semiconductor device according to claim 1, wherein with respect to the virtual centerline of the semiconductor chip, the first electrode pad group and the third electrode pad group are symmetrical and the second electrode pad group and the fourth electrode pad group are symmetrical.

5. The semiconductor device according to claim 1, wherein with respect to the virtual centerline of the semiconductor chip, the first bonding pad group and the third bonding pad group are symmetrical and the second bonding pad group and the fourth bonding pad group are symmetrical.

6. The semiconductor device according to claim 1, wherein the first conductive wires, the second conductive wires, the third conductive wires, and the fourth conductive wires comprise gold wires.

7. The semiconductor device according to claim 1, wherein the interconnection substrate comprises:
a core material;
a second wiring layer formed on a front surface of the core material;
an upper insulating layer formed on the front surface of the core material so as to cover the second wiring layer;
a first wiring layer formed on a front surface of the upper insulating layer;
a third wiring layer formed on a back surface of the core material;
a lower insulating layer formed on the back surface of the core material so as to cover the third wiring layer; and
a fourth wiring layer formed on a surface of the lower insulating layer,
wherein the first wiring layer extends in a direction from the first side of the interconnection substrate to the second side of the interconnection substrate.

8. The semiconductor device according to claim 7, wherein the third wiring layer extends in a direction from the third side of the interconnection substrate to the fourth side of the interconnection substrate.

9. The semiconductor device according to claim 7, wherein the second wiring layer comprises a GND wiring.

10. The semiconductor device according to claim 1, wherein among the bonding pads of each of the first bonding pad group, the second bonding pad group, the third bonding pad group, and the fourth bonding pad group, bonding pads joined to GND wirings are located on both sides of a bonding pad joined to a signal wiring.

11. The semiconductor device according to claim 1, wherein the semiconductor chip comprises a semiconductor chip designed for flip chip bonding.

12. The semiconductor device according to claim 1, wherein the second and fourth electrode pad groups are formed adjacent to the virtual centerline in a central portion of the semiconductor chip.

13. The semiconductor device according to claim 1, wherein in a direction along the two long sides of the semiconductor chip, an electrode pad of the first, second, third and fourth electrode pad groups comprises an outermost electrode pad formed on the semiconductor chip.

14. The semiconductor device according to claim 1, wherein an electrode pad of the first, second, third and fourth electrode pad groups comprises an electrode pad formed on the semiconductor chip and nearest to the third and fourth sides of the interconnection substrate.

15. The semiconductor device according to claim 1, wherein a distance between the first electrode pad group and the second electrode pad group is greater than a distance between the virtual centerline and the second electrode pad group.

* * * * *